United States Patent
Lin et al.

(10) Patent No.: US 12,414,355 B2
(45) Date of Patent: Sep. 9, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Ta-Chun Lin, Hsinchu (TW); Ming-Che Chen, Hsinchu (TW); Jyun-Yang Shen, Kaohsiung (TW); Yu-Chang Liang, Kaohsiung (TW); Chun-Jun Lin, Hsinchu (TW); Kuo-Hua Pan, Hsinchu (TW); Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 454 days.

(21) Appl. No.: 17/859,543

(22) Filed: Jul. 7, 2022

(65) Prior Publication Data
US 2024/0014074 A1    Jan. 11, 2024

(51) Int. Cl.
*H10D 84/03* (2025.01)
*H10D 30/62* (2025.01)
(Continued)

(52) U.S. Cl.
CPC ....... *H10D 84/038* (2025.01); *H10D 30/6219* (2025.01); *H10D 62/151* (2025.01);
(Continued)

(58) Field of Classification Search
CPC ..... H01L 21/823864; H01L 21/823814; H01L 21/823821; H01L 21/823871; H01L 27/0924; H01L 29/0847; H01L 29/41791; H10D 84/038; H10D 30/6219; H10D 62/151; H10D 84/017; H10D 84/0184; H10D 84/0186; H10D 84/0193; H10D 84/853

See application file for complete search history.

(56) References Cited

U.S. PATENT DOCUMENTS

| 8,962,400 B2 | 2/2015 | Tsai et al. |
| 9,093,514 B2 | 7/2015 | Tsai et al. |

(Continued)

*Primary Examiner* — Fernando L Toledo
*Assistant Examiner* — Adam S Bowen
(74) *Attorney, Agent, or Firm* — Cooper Legal Group, LLC

(57) ABSTRACT

A method for manufacturing a semiconductor device is provided. The method includes forming first and second semiconductor fins; forming first and second gate structures respectively over first regions of the first and second semiconductor fins; forming a first dummy spacer at a sidewall of the first gate structure adjacent a second region of the first semiconductor fin; etching a first source/drain recess in the second region of the first semiconductor fin; forming a n-type source/drain epitaxial structure in the first source/drain recess; forming a second dummy spacer at a sidewall of the second gate structure adjacent a second region of the second semiconductor fin, wherein the second dummy spacer has a thickness less than that of the first dummy spacer; etching a second source/drain recess in the second region of the second semiconductor fin; and forming a p-type source/drain epitaxial structure in the second source/drain recess.

20 Claims, 43 Drawing Sheets

(51) Int. Cl.
  *H10D 62/13*  (2025.01)
  *H10D 84/01*  (2025.01)
  *H10D 84/85*  (2025.01)

(52) U.S. Cl.
  CPC ....... *H10D 84/017* (2025.01); *H10D 84/0184* (2025.01); *H10D 84/0186* (2025.01); *H10D 84/0193* (2025.01); *H10D 84/853* (2025.01)

(56) References Cited

U.S. PATENT DOCUMENTS

| | | |
|---|---|---|
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 2016/0149017 A1* | 5/2016 | Tsai .................. H01L 21/28247 257/288 |

* cited by examiner

SEMICONDUCTOR DEVICE AND MANUFACTURING METHOD THEREOF

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as a metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
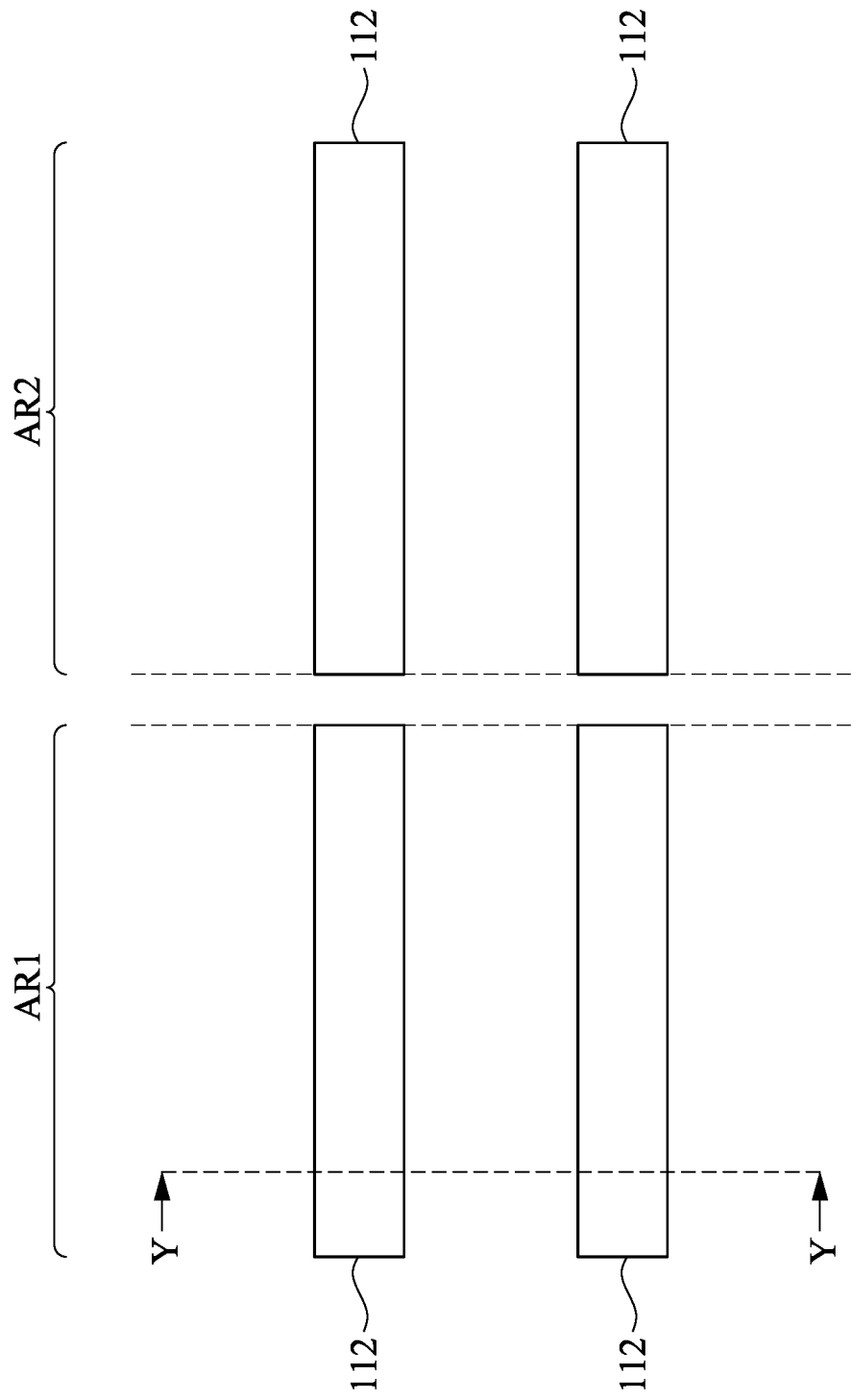
FIGS. 1A-16B illustrate a method of manufacturing a semiconductor device at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a p-type metal-oxide-semiconductor (PMOS) FinFET device and an n-type metal-oxide-semiconductor (NMOS) FinFET device. The following disclosure will continue with a FinFET example to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Source/drain region(s) may refer to a source or a drain, individually or collectively dependent upon the context.

Embodiments of the disclosure include manufacturing a semiconductor device With a dopant-diffusion-aware design. A diffusivity of dopants in source/drain epitaxial structures may be different according to the dopant species and semiconductor material of the source/drain epitaxial structures. Depending on the dopant diffusivity of the source/drain epitaxial structures, dummy spacers, which limits the space for source/drain epitaxial growth, are designed with different thickness for the devices using different dopant species (e.g., PMOS and NMOS). Through the design, the source/drain epitaxial structures of one of the PMOS and NMOS fabricated using the thinner dummy spacers may have more proximity push than the source/drain epitaxial structures of the another one of the PMOS and NMOS fabricated using the thicker dummy spacers, thereby improving the junction overlap and epitaxial strain.

FIGS. 1A-16B illustrate a method of manufacturing a semiconductor device at various stages in accordance with some embodiments. FIGS. 1A, 2A, 7A, 11A, 13A, and 14A, are top views of the integrated circuit device at various stages in accordance with some embodiments. FIGS. 1B, 2B, and 14B are cross-sectional views of the semiconductor device (e.g., taken along line Y-Y in FIGS. 1A, 2A, and 14A) at various manufacturing stages in accordance with some embodiments. FIGS. 2C, 3A, 4A, 5A, 6A, 7B, 8A, 9A, 10A, 11B, 12A, 13B, 14B, 15A, and 16A are cross-sectional views of the semiconductor device (e.g., taken along line X1-X1 in FIGS. 2A, 7A, 11A, 13A, and 14A) at various manufacturing stages in accordance with some embodiments. FIGS. 2D, 3B, 4B, 5B, 6B, 7C, 8B, 9B, 10B, 11C, 12B, 13C, 14C, 15B, and 16B are cross-sectional views of the semiconductor device (e.g., taken along line X2-X2 in FIGS. 2A, 7A, 11A, 13A, and 14A) at various manufacturing stages in accordance with some embodiments. FIG. 6C is an enlarged view of a portion of the semiconductor device in FIG. 6A. FIG. 10C is an enlarged view of a portion of the semiconductor device in FIG. 10A. FIGS. 12C and 12D are enlarged view of portions of the semiconductor device in FIG. 12A. It is understood that additional steps may be provided before, during, and after the steps shown in FIGS. 1A-16B, and some of the steps described below can be replaced or eliminated for additional embodiments of the method. The order of the operations/processes may be interchangeable.

Figure 1B:
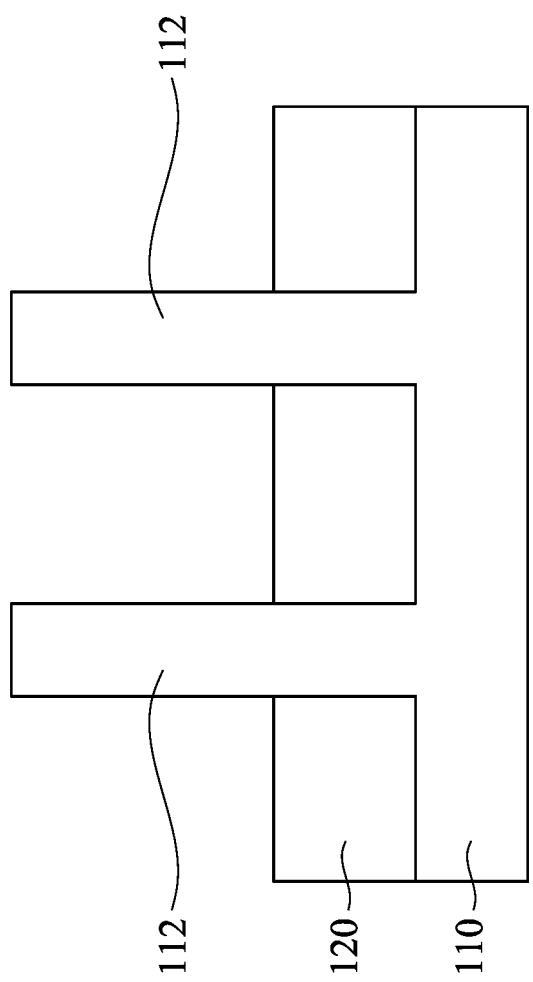
Figure 2A:
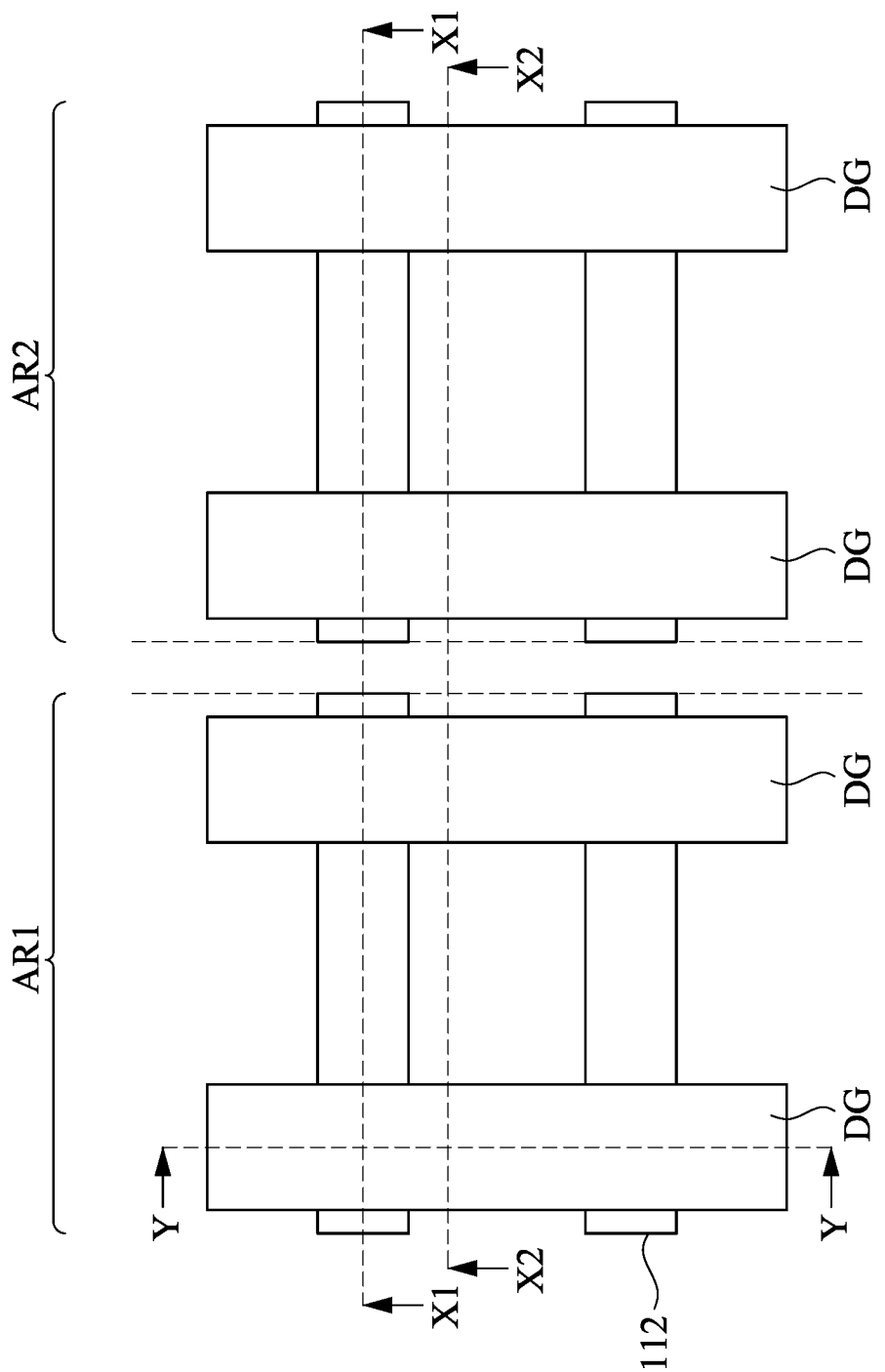
Figure 2B:
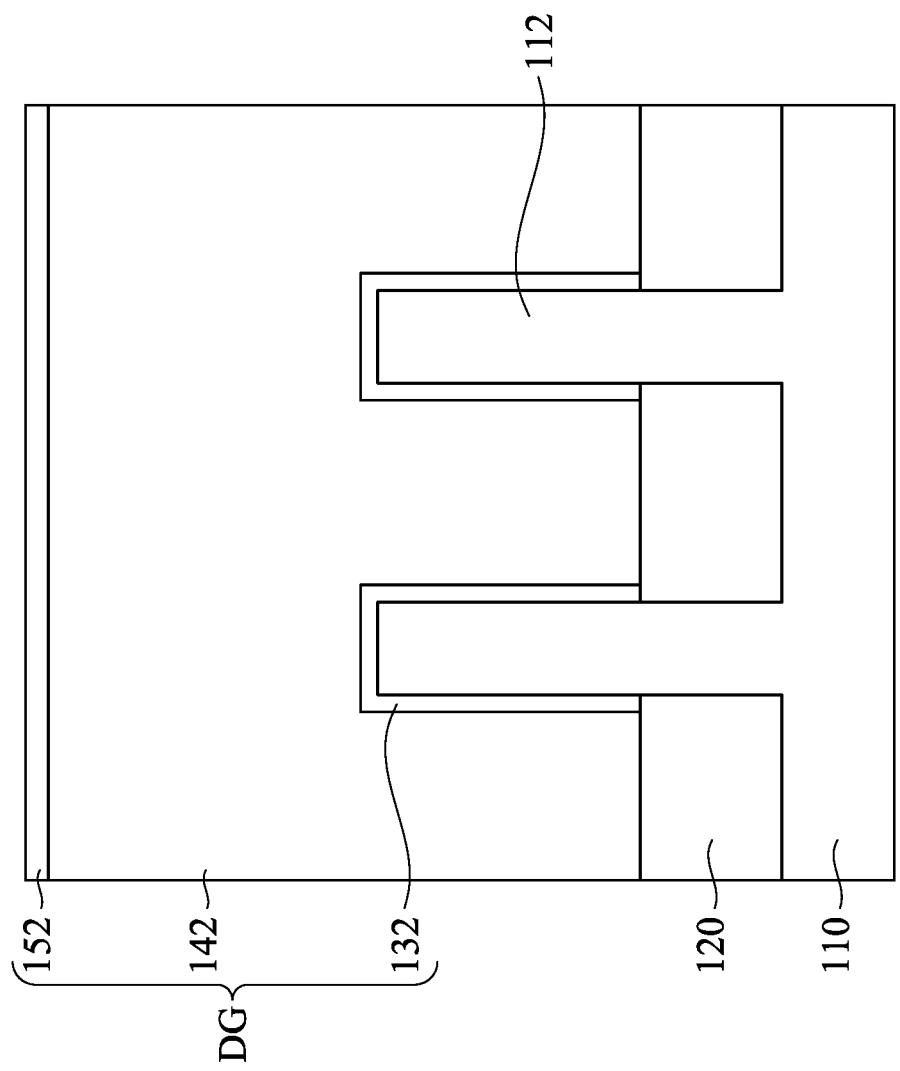
Figure 2C:
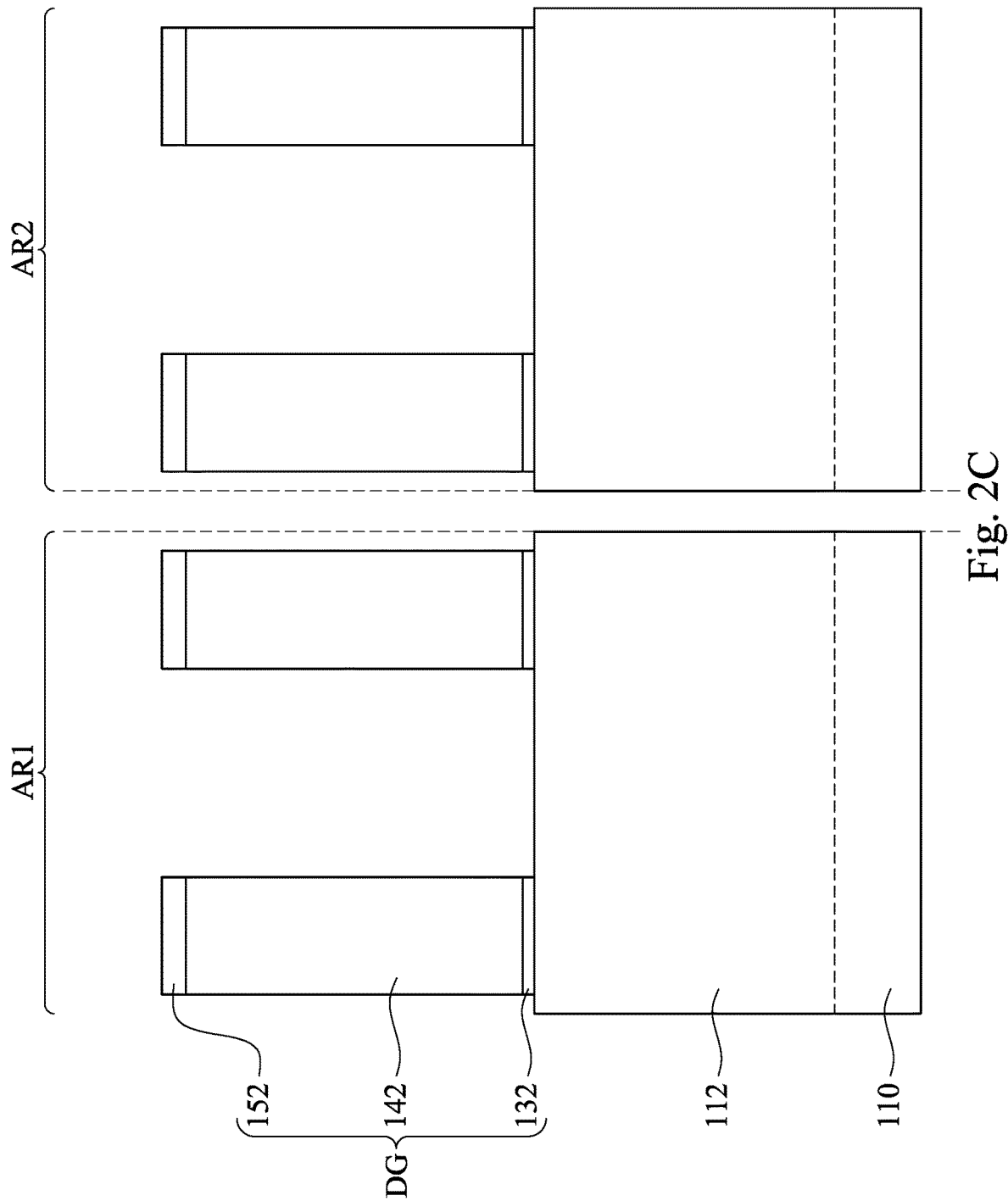
Figure 2D:
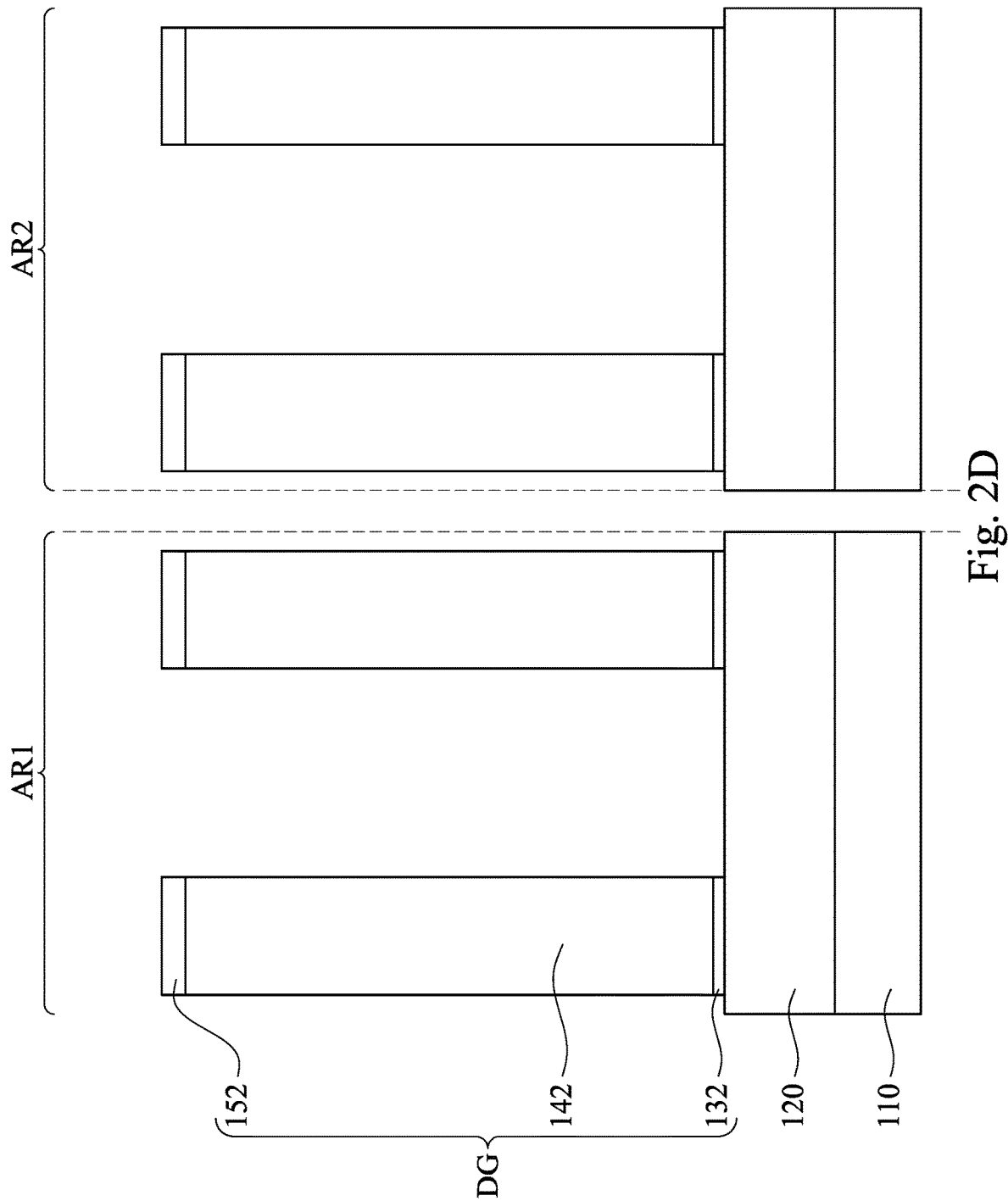

FIGS. 1A and 1B illustrate a top view and a cross-sectional view of formation of semiconductor fins 112 extending from a substrate 110. The substrate 110 may be a bulk silicon substrate. Alternatively, the substrate 110 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 110 also include a silicon-on-insulator (SOI) substrate. SOI substrates are fabricated using separation by implantation of oxygen (SIMOX), wafer bonding, and/or other suitable methods.

The substrate 110 may also include various doped regions. The doped regions may be doped with p-type dopants, such as boron or $BF_2$; n-type dopants, such as phosphorus or arsenic; or combinations thereof. The doped regions may be formed directly on the substrate 110, in a P-well structure, in an N-well structure, in a dual-well structure, and/or using a raised structure. The substrate 110 may include a region AR1 and a region AR2 for devices with source/drain epaxial structures of different diffusivities. In illustrated embodiments, the region AR1 is configured for a n-type device (e.g., NMOS), and the region AR2 is configured for a p-type device (e.g., PMOS). For example, the region AR2 may be lightly doped with n-type dopants to form a n-well region therein, and the region AR1 may be lightly doped with p-type dopants to form a p-well region therein. In some other embodiments, the regions AR1 and AR2 can be configured for n-type devices (e.g., NMOS) with source/drain epaxial structures of different diffusivities; or the regions AR1 and AR2 can be configured for p-type devices (e.g., PMOS) with source/drain epaxial structures of different diffusivities.

The semiconductor fins 112 may be formed by any suitable method. For example, the semiconductor fins 112 may be formed by using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

A plurality of isolation structures 120 are formed over the substrate 110 and interposing the semiconductor fins 112. The isolation structures 120 may act as a shallow trench isolation (STI) around the semiconductor fins 112. The isolation structures 120 may be formed by depositing a dielectric material around the fins 112, followed by a recessing etching process that lowers top surfaces of the dielectric material. In some embodiments, a dielectric layer is first deposited over the substrate 110, filling the trenches between the fins 112 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the structure may be annealed, for example, to improve the quality of the dielectric layer. In some embodiments, the dielectric layer (and subsequently formed isolation structures 120) may include a multi-layer structure, for example, having one or more liner layers.

After deposition of the dielectric layer, the deposited dielectric material may be thinned and planarized, for example by a chemical mechanical polishing (CMP) process. Subsequently, the isolation structures 120 interposing the fins 112 may be recessed. For example, the isolation structures 120 are recessed providing the fins 112 extending above the isolation structures 120. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the fins 112.

FIGS. 2A-2D illustrate a top view and plural cross-sectional views of formation of dummy gate structures DG. The dummy gate structures DG are formed around the semiconductor fins 112 of the substrate 110. In some embodiments, each of the dummy gate structure DG includes a dummy gate 142 and a gate dielectric 132 underlying the dummy gate 142. The dummy gates 142 may include polycrystalline-silicon (poly-Si) or poly-crystalline silicon-germanium (poly-SiGe). Further, the dummy gates 142 may be doped poly-silicon with uniform or non-uniform doping. The gate dielectrics 132 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

In some embodiments, the dummy gate structures DG may be formed by, for example, forming a stack of a gate dielectric layer and a dummy gate material layer over the substrate 110. A patterned mask 152 is formed over the stack of gate dielectric layer and dummy gate material layer. The patterned mask 152 may be a hard mask (HM) layer patterned through suitable photolithography process. For example, the patterned mask 152 may include silicon nitride, silicon oxy nitride, the like, or the combination thereof. Then, the gate dielectric layer and the dummy gate material layer may be patterned using one or more etching processes, such as one or more dry plasma etching processes or one or more wet etching processes. During the etching process, the patterned mask 152 may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the gate dielectric layer until the semiconductor fins 112 and the isolation structures 120 are exposed.

Figure 3A:
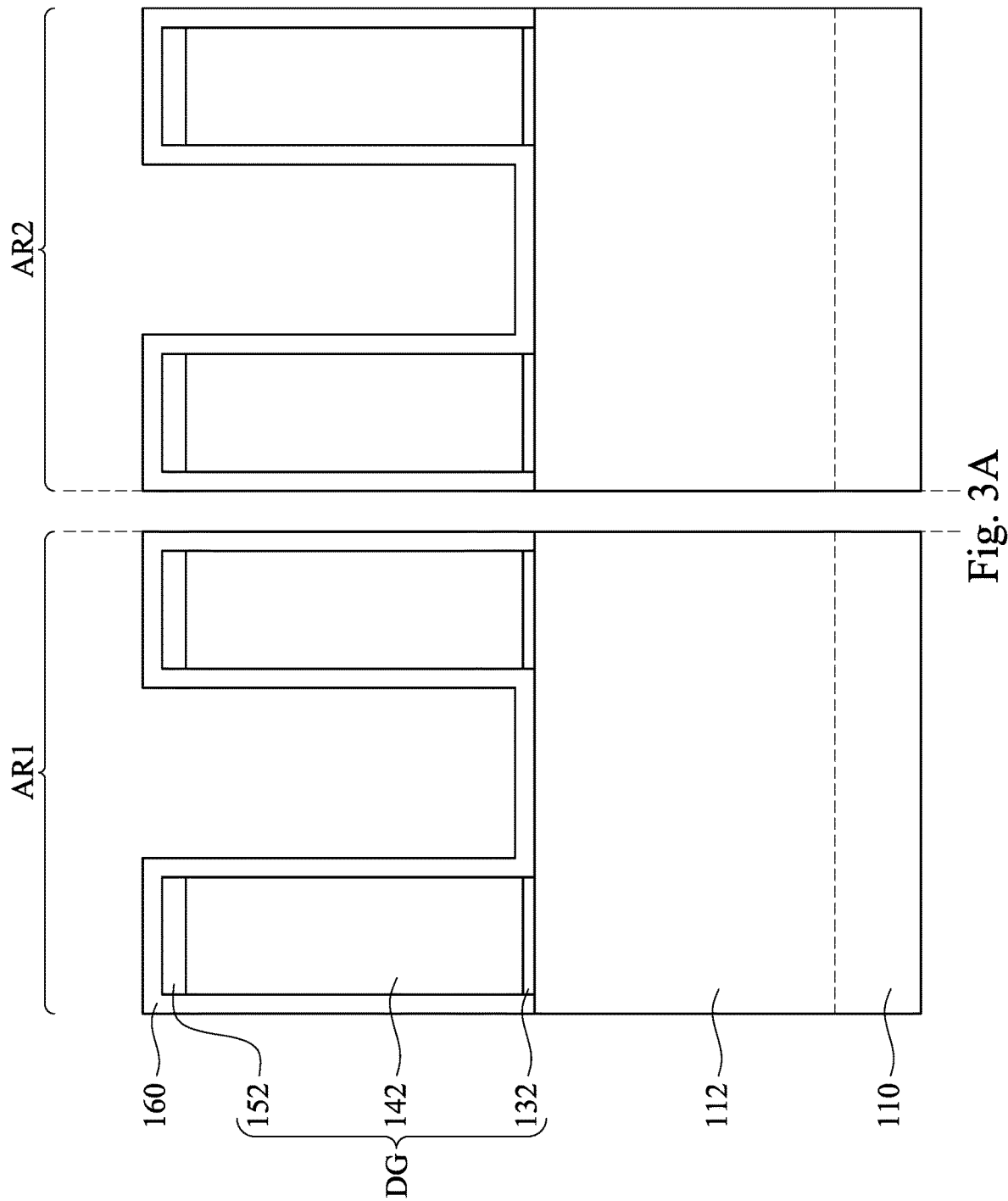
Figure 3B:
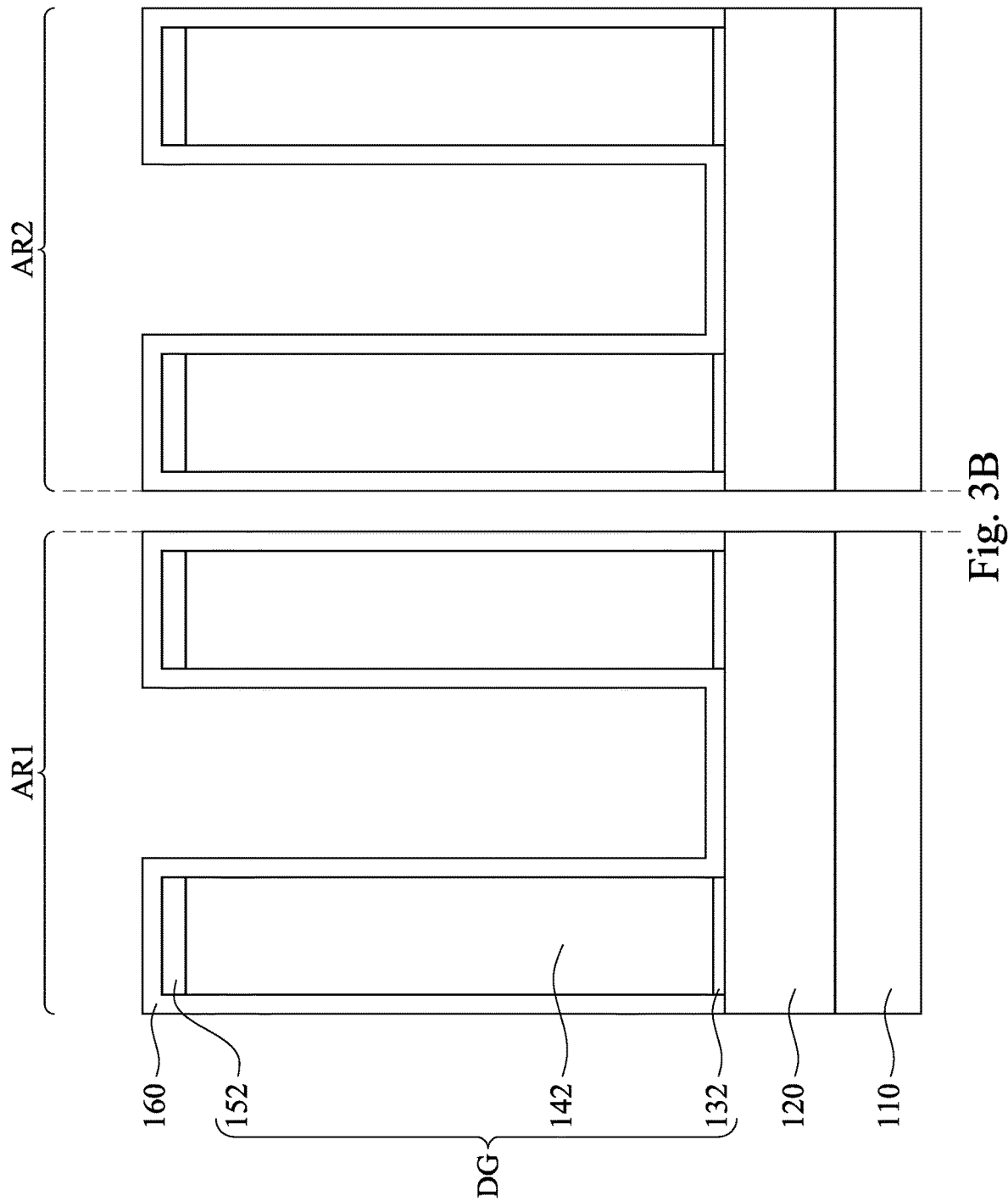

FIGS. 3A and 3B illustrate cross-sectional views formation of a gate spacer layer 160. In the illustrated embodiments, the gate spacer layer 160 is conformally deposited on top surfaces of the dummy gate structures DG and alongside sidewalls of the dummy gate structures DG. The gate spacer layer 160 may include a dielectric material such as $SiO_2$, SiON, SiCON, SiCO, the like, and/or combinations thereof. The gate spacer layer 160 may be a single-layer structure or a multi-layer structures that includes multiple layers. The gate spacer layer 160 may be deposited by suitable processes such as, CVD process, an ALD process, a PVD process, or other suitable process.

Figure 4A:
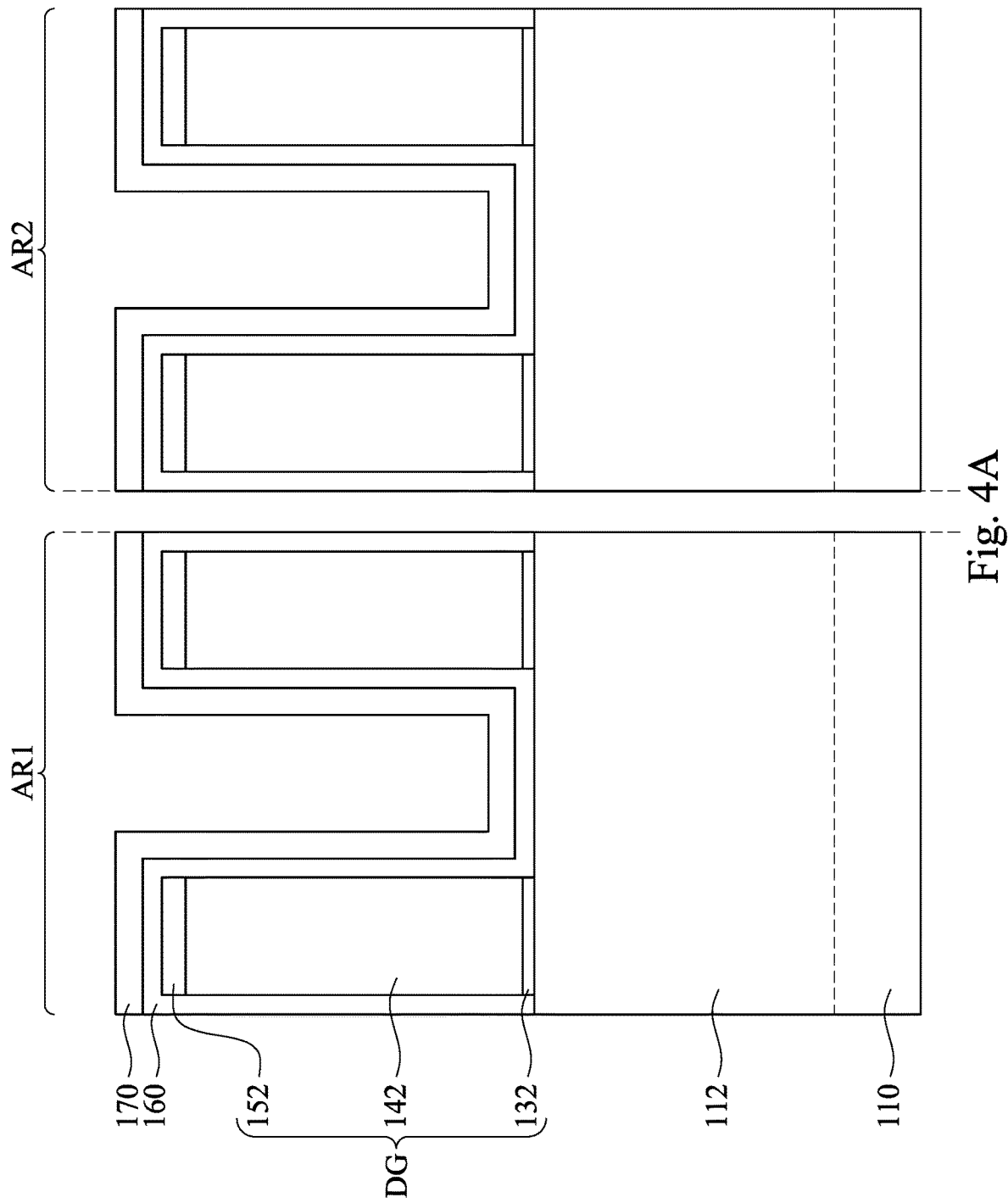
Figure 4B:
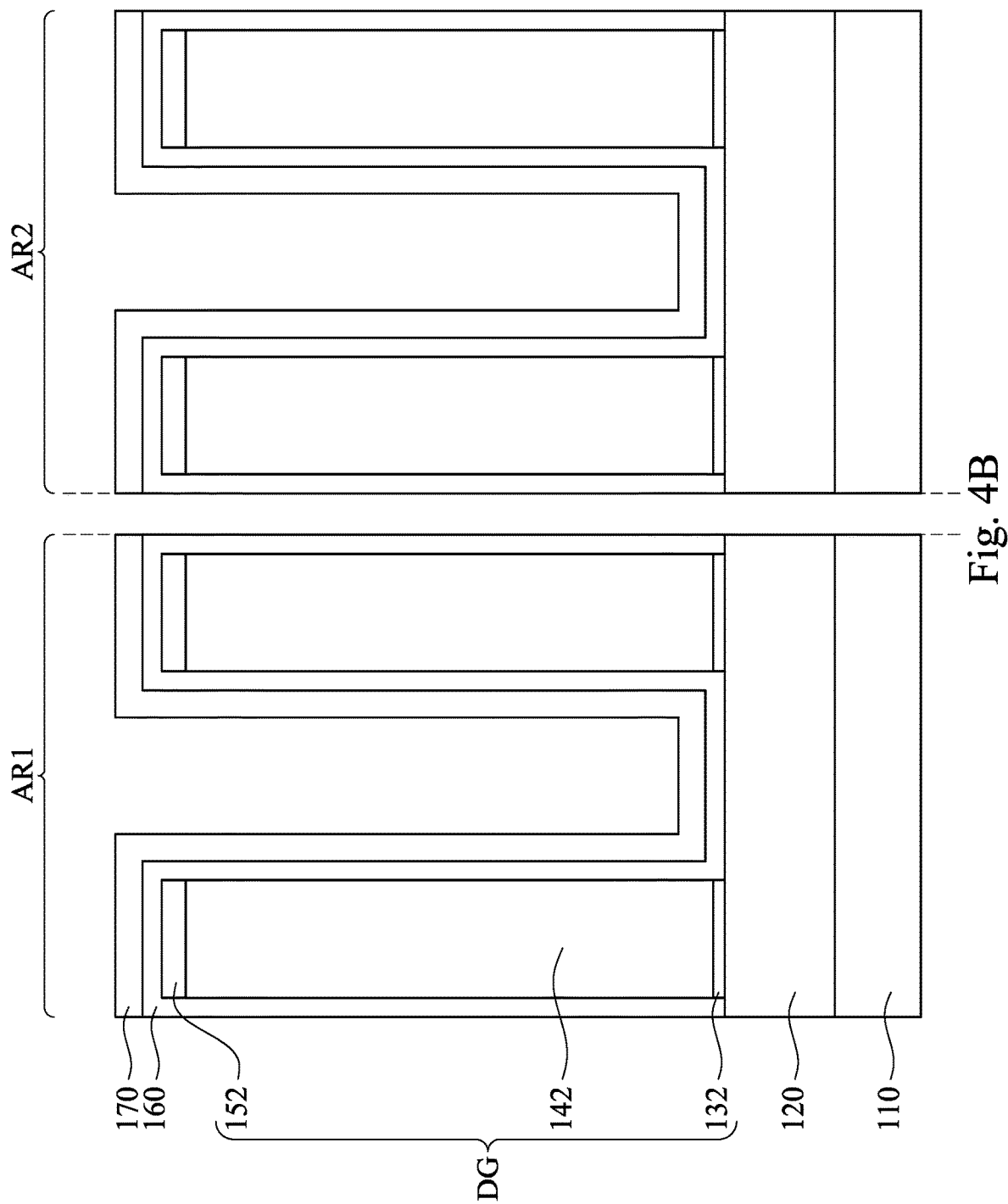

FIGS. 4A and 4B illustrate cross-sectional views formation of a sacrificial spacer layer 170. The sacrificial spacer layer 170 may be conformally deposited over the gate spacer layer 160. The sacrificial spacer layer 170 may include a different material than that of the gate spacer layer 160, to maintain a suitable etch selectivity between the gate spacer layer 160 and the sacrificial spacer layer 170, and have less chemical influence to subsequent formed epitaxial structures. For example, the sacrificial spacer layer 170 may include SiN, SiCN, SiCON, SiON, $Al_2O_3$, the like, and/or combinations thereof. The sacrificial spacer layer 170 may have a less oxide concentration and/or a less carbon concentration than that of the gate spacer layer 160. In some embodiments, the sacrificial spacer layer 170 may have a higher k value than that of the gate spacer layer 160. For example, the sacrificial spacer layer 170 may have a k value greater than about 5, or even greater than about 6, while the gate spacer layer 160 may have a k value less than about 5. Stated differently, the sacrificial spacer layer 170 may include a high k dielectric material, while the gate spacer 160 may include a low k dielectric material. The sacrificial spacer layer 170 can be deposited by ALD, CVD, the like, or the combination thereof.

Figure 5A:
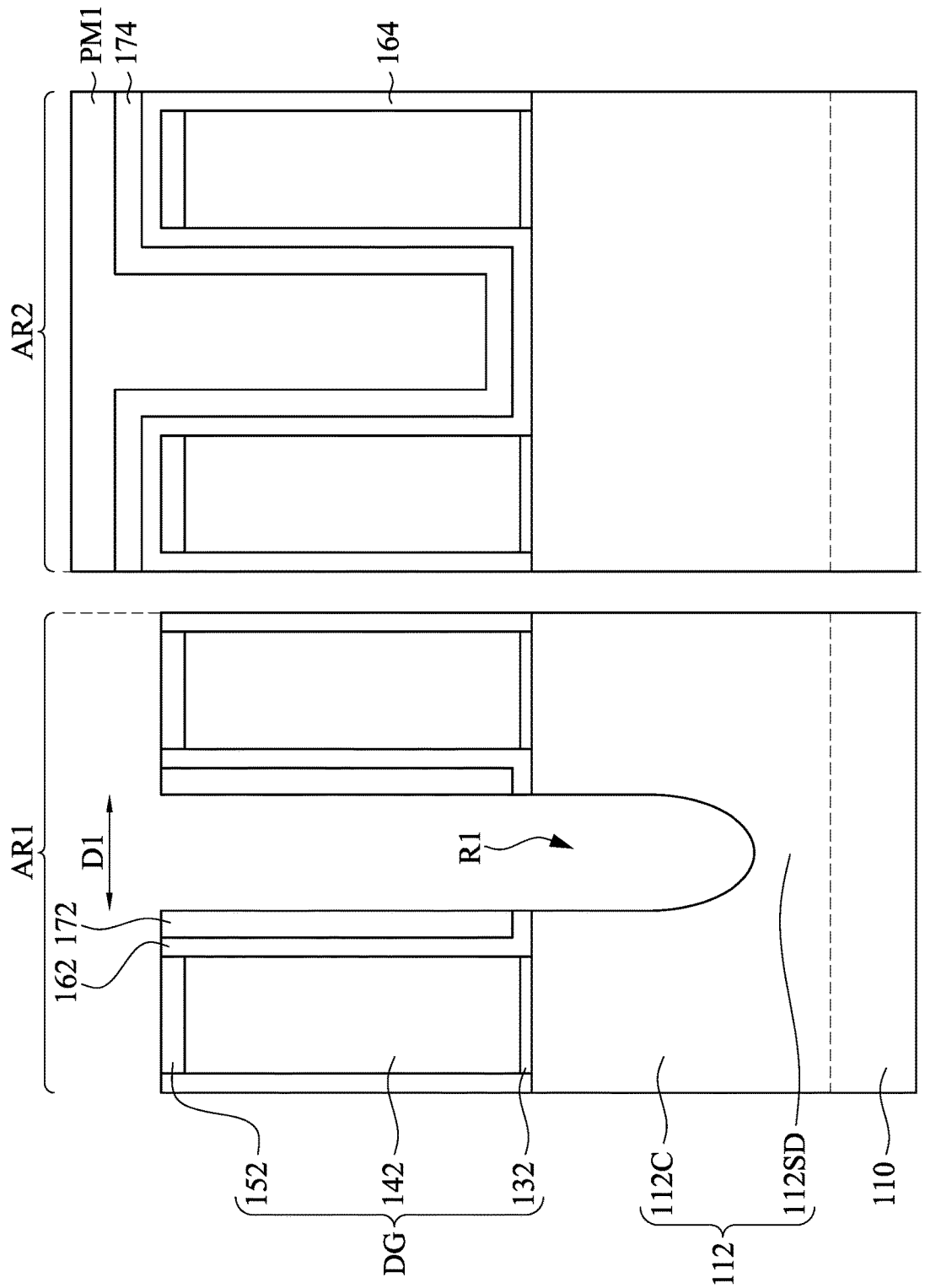
Figure 5B:
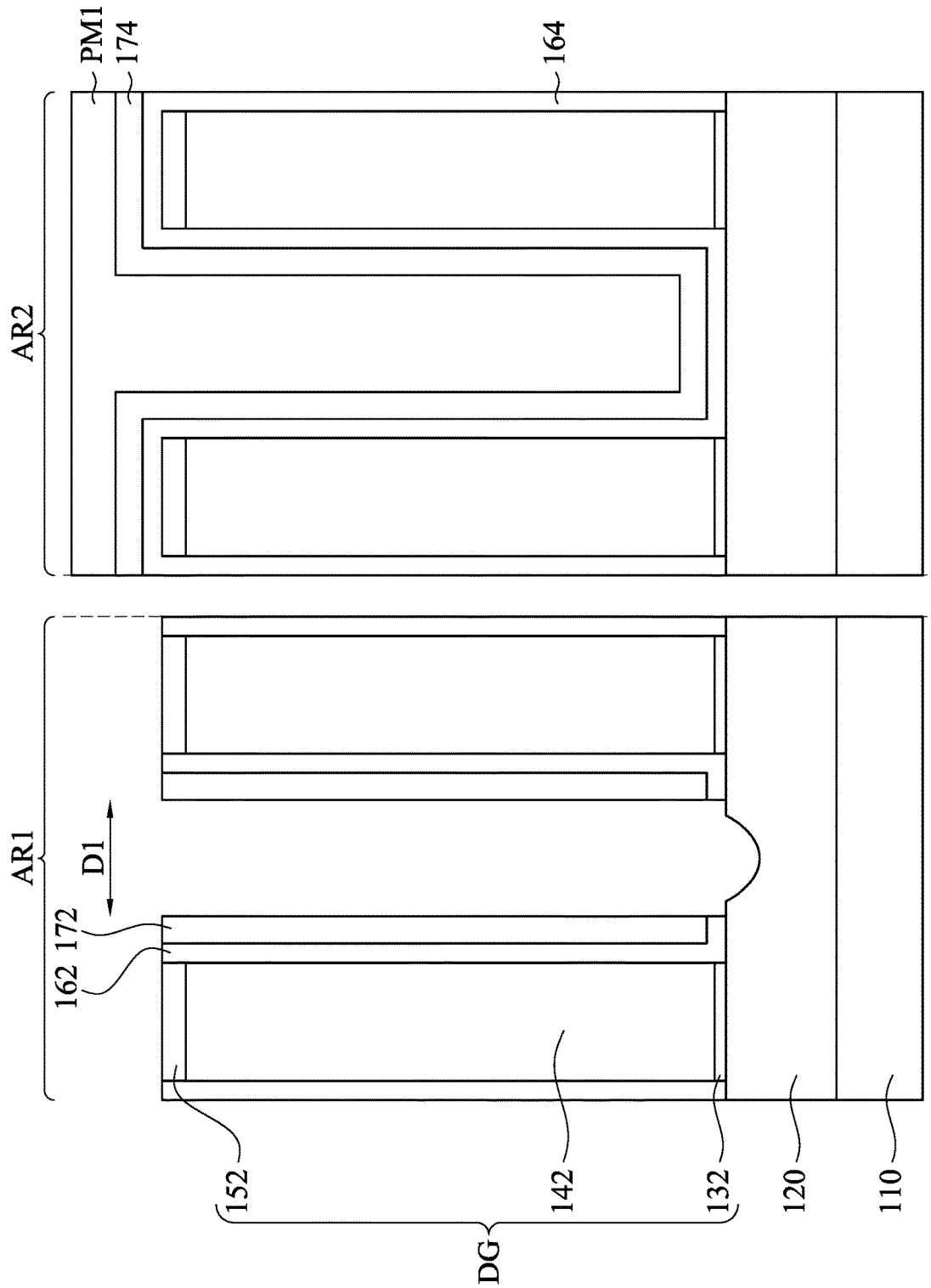

FIGS. 5A and 5B illustrate cross-sectional views of recessing portions of the semiconductor fins 120. A patterned mask PM1 is formed to cover/mask the region AR2 and expose/unmask the region AR1. In some embodiments, the patterned mask PM1 may include a photoresist formed by a photolithography process. An exemplary photolithography process may include processing steps of photoresist coating, soft baking, mask aligning, exposing, post-exposure baking, developing photoresist and hard baking. In some embodiments, the patterned mask PM1 may further include a planarized sacrificial layer below the photoresist. The planarized sacrificial layer, for example, can be an organic material used for the bottom anti-reflection coating (BARC).

With the patterned mask PM1 covering the region AR2, an anisotropic etching process may be performed to etch the sacrificial spacer layer 170 and the gate spacer layer 160 (referring to FIGS. 4A and 4B), thereby exposing regions 112SD of the fins 112 uncovered by the dummy gate structures DG. In the region AR1, this anisotropic etching process may remove horizontal portions of the layers 170 and 160 (referring to FIGS. 4A and 4B) directly above the dummy gate structures DG and horizontal portions of the layers 170 and 160 extending along a top surface of the fins 112. Vertical portions of the layers 170 and 160 (referring to FIGS. 4A and 4B) on sidewalls of the dummy gate structures DG may remain, forming gate spacers, which are respectively denoted as the dummy spacers 172 and gate spacers 162, for the sake of simplicity. The dummy spacers 172 may be spaced apart from each other by a distance D1, and the regions 112SD exposed by the dummy spacers 172 may have a width substantially equal to the distance D1. The patterned mask PM1 may protect portions of the sacrificial spacer layer 170 and the gate spacer layer 160 (referring to FIGS. 4A and 4B) in the region AR2 from the anisotropic etching process. Thus, the portions of the sacrificial spacer layer 170 and the gate spacer layer 160 (referring to FIGS. 4A and 4B) in the region AR2 may remain as spacer layers, which are respectively denoted as the spacer layers 174 and 164, for the sake of simplicity.

After the formation of the dummy spacers 172 and gate spacers 162, portions of the semiconductor fins 112 uncovered by the dummy gate structures DG and the dummy spacers 172 and gate spacers 162 in the region AR1 are recessed, such that each of the remaining semiconductor fins 112 in the region AR1 include a recessed region 112SD uncovered by the dummy gate structures DG and a channel region 112C covered by the dummy gate structures DG, respectively. Through the recessing, a plurality of recesses R1 are formed in the semiconductor fins 112 of the substrate 110. The recessing of the semiconductor fins 112 may include one or more etching process. The etching process may include dry etch, wet etch, or the combination thereof. The dry etching processes may include a biased plasma etching process that uses a fluorine-based chemistry (e.g., $CF_4$, $SF_6$, $CH_2F_2$, $CHF_3$, and/or $C_4F_8$). Dry etching may also be performed anisotropically using such mechanisms as DRIE (deep reactive-ion etching). The anisotropic etching process may result in little lateral etching. In some embodiments, the spacers 162 and 172 and the patterned mask 152 may have a higher etch resistance to the etching process, thereby serve as etch masks during recessing the regions 112SD of the semiconductor fins 112. The patterned mask PM1 may protect the region AR2 from being damaged during these etching processes. After these etching processes, the patterned mask PM1 can be removed by suitable stripping or ashing process.

Figure 6A:
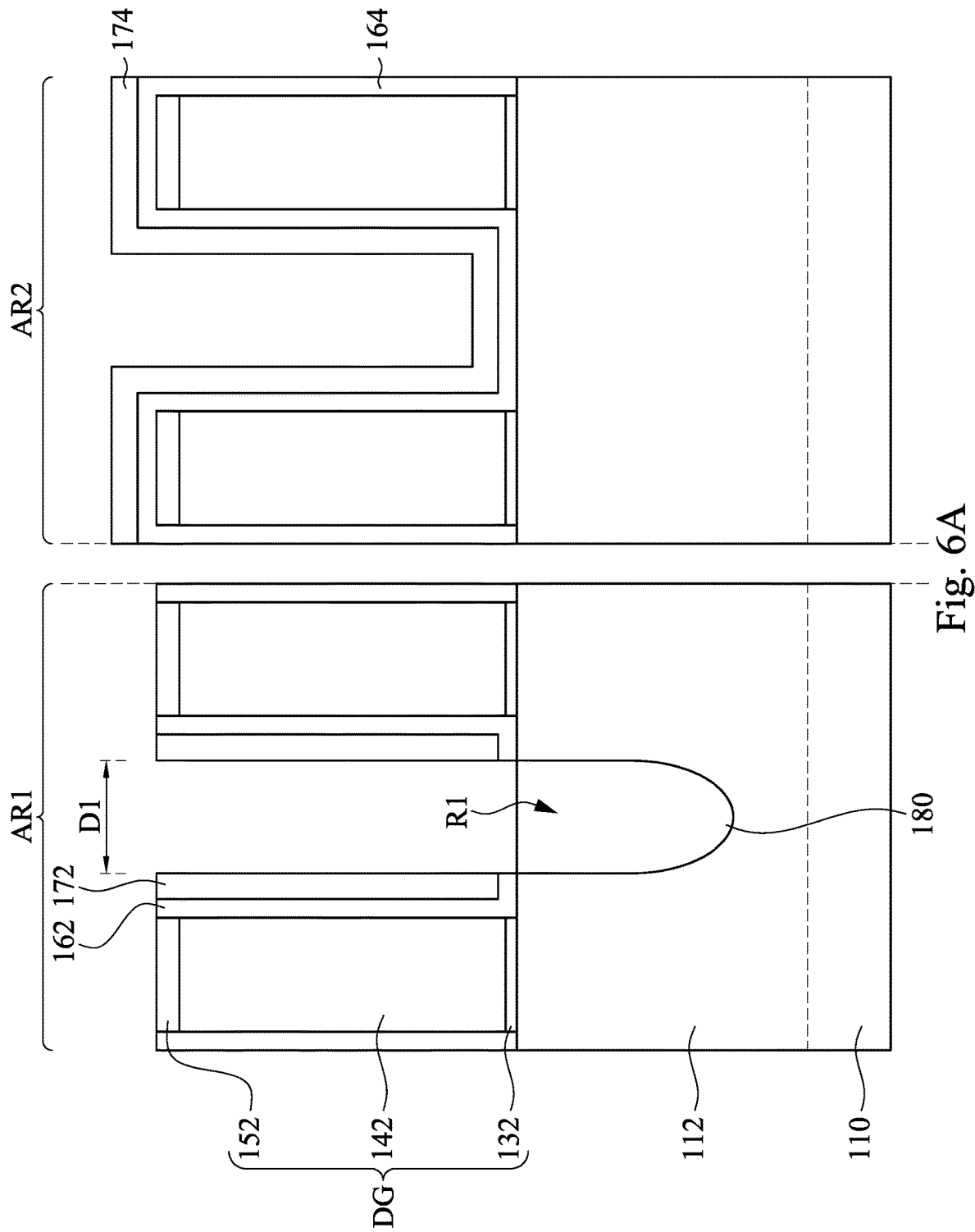
Figure 6B:
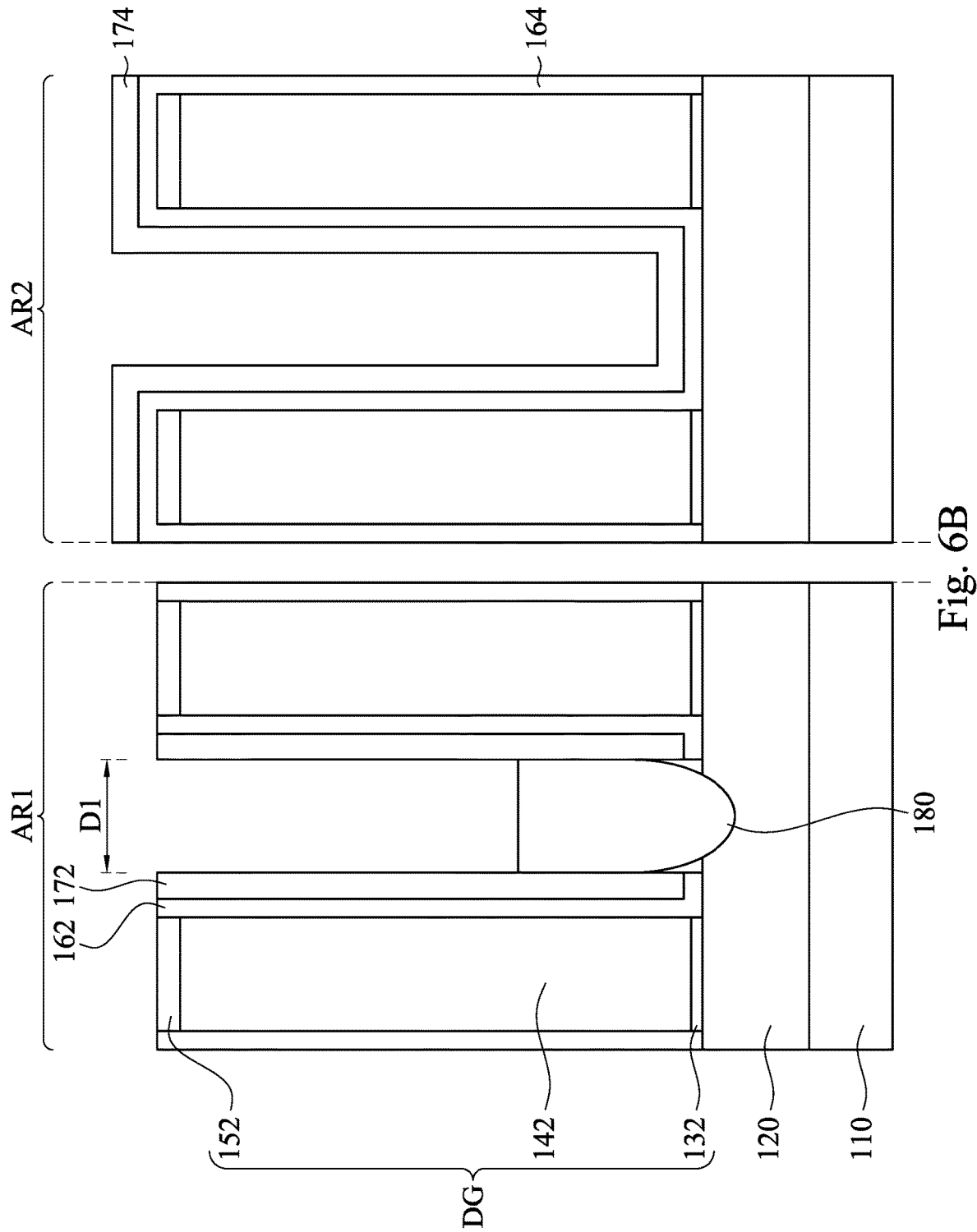
Figure 6C:
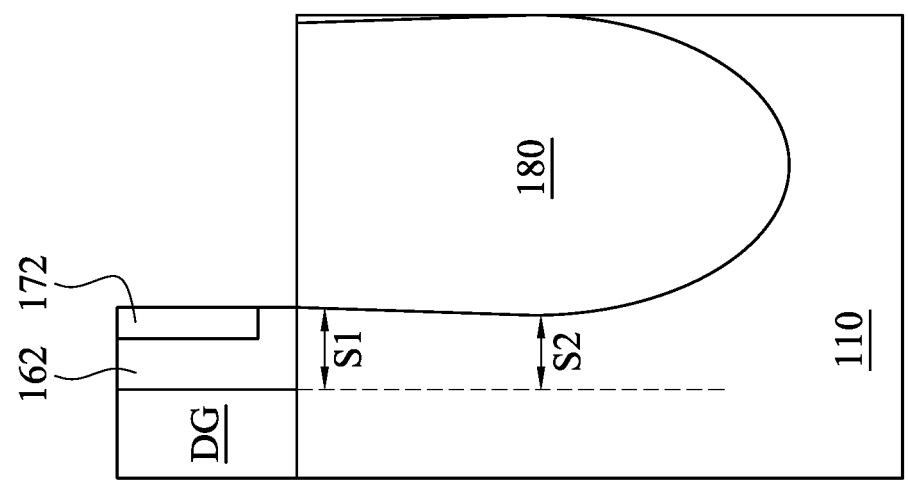

FIGS. 6A and 6B illustrate cross-sectional views of formation of a source/drain epitaxial structure 180. A source/drain epitaxial structure 180 is formed in the recesses R1 in the semiconductor fins 112 and between the dummy gate structures DG. In some embodiments, the source/drain epitaxial structure 180 may also be referred to as an epitaxy feature. The source/drain epitaxial structure 180 may be formed using one or more epitaxy or epitaxial (epi) processes, such that one or more semiconductor materials can be formed in a crystalline state on the semiconductor fins 112. In some embodiments, a lattice constant of the source/drain epitaxial structure 180 is different from a lattice constant of the semiconductor fin 112, such that channels in the channel regions 112C of the semiconductor fins 112 are strained or stressed to enable carrier mobility of the semiconductor device and enhance the device performance. In the illustrated embodiments, the source/drain epitaxial structure 180 is a n-type epitaxial structure, which may include a suitable n-type semiconductor material, such as germanium (Ge) or silicon (Si); or compound semiconductor materials, such as silicon carbide (SiC). In some other embodiments, the source/drain epitaxial structure 180 may be a p-type epitaxial structure, which may include a suitable semiconductor material, such as germanium (Ge) or silicon (Si); or compound semiconductor materials, such as silicon germanium (SiGe). The source/drain epitaxial structures 180 may include one or plural epitaxial layers, in which the plural epitaxial layers may have different compositions.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112 (e.g., silicon). The source/drain epitaxial structure 180 may be in-situ doped. The doping species include n-type dopants, such as phosphorus or arsenic, for the n-type source/drain epitaxial structure 180. In some other embodiments where the source/drain epitaxial structure 180 is a p-type source/drain epitaxial structure, doping species include p-type dopants, such as boron or $BF_2$. If the source/drain epitaxial structure 180 is not in-situ doped, a second implantation process (i.e., a junction implant process) is performed to dope the source/drain epitaxial structure 180. One or more annealing processes may be performed to activate the source/drain epitaxial structure 180. The annealing processes include rapid thermal annealing (RTA) and/or laser annealing processes.

FIG. 6C is an enlarged view of a portion of the semiconductor device in FIG. 6A. The source/drain epitaxial structure 180 is offset from a sidewall of the dummy gate structure DG by the spacers 162 and 172. In FIG. 6C, distances from a sidewall of the source/drain epitaxial structure 180 to the sidewall of the gate structure (e.g., dummy gate structures DG) are indicated as distances S1 and S2 at a surface (or fin top) and middle positions, respectively.

Figure 7A:
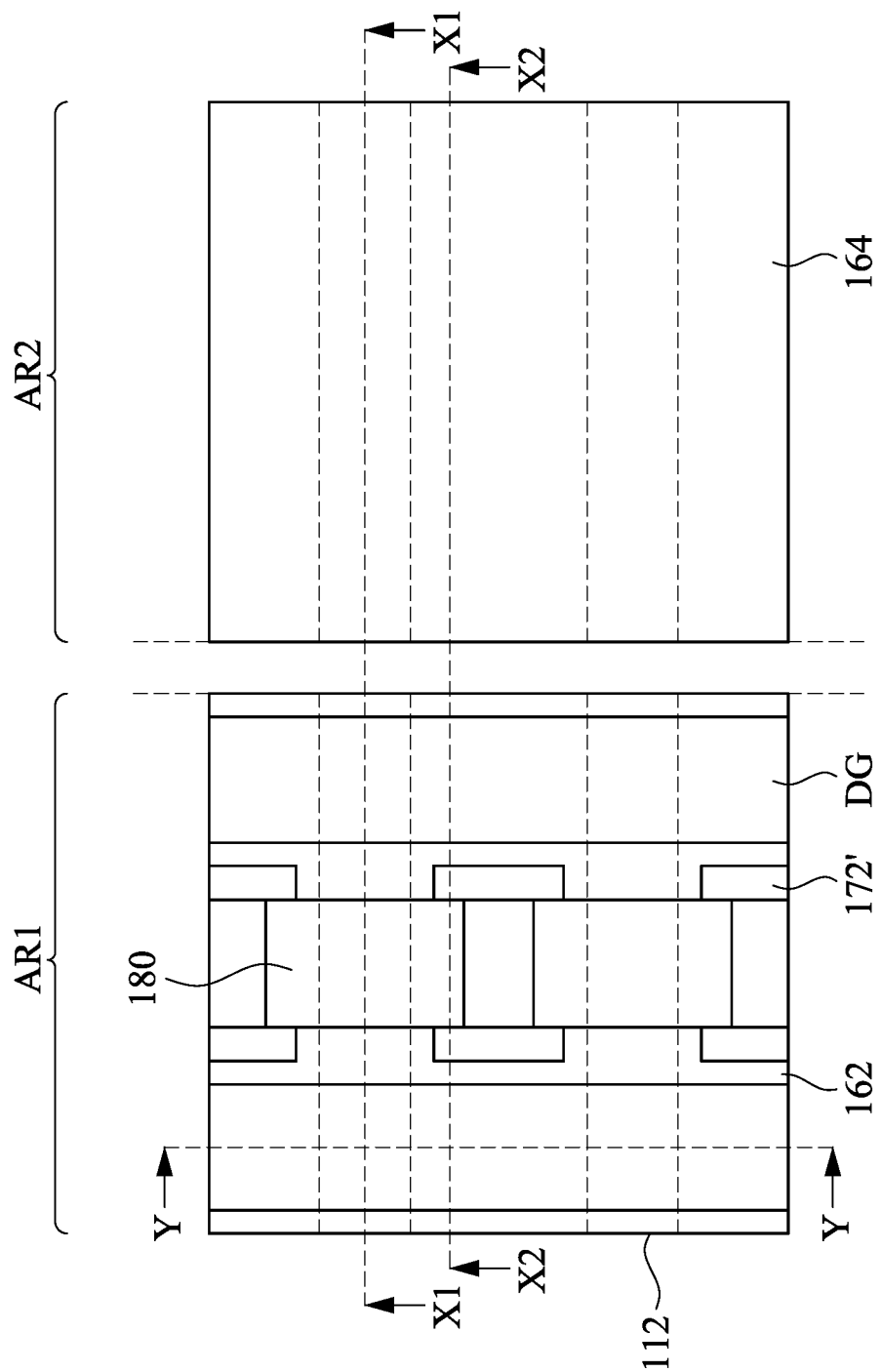
Figure 7B:
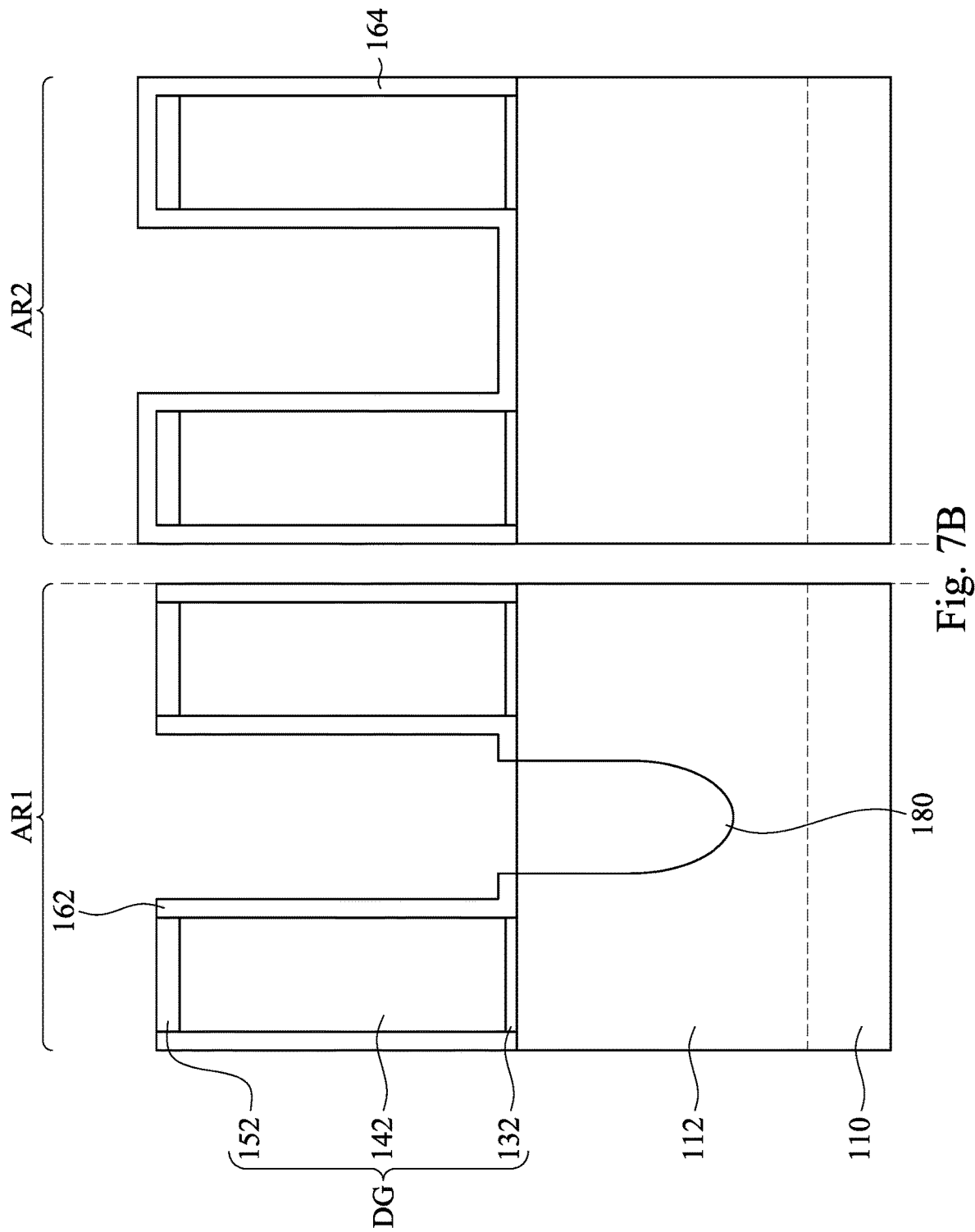
Figure 7C:
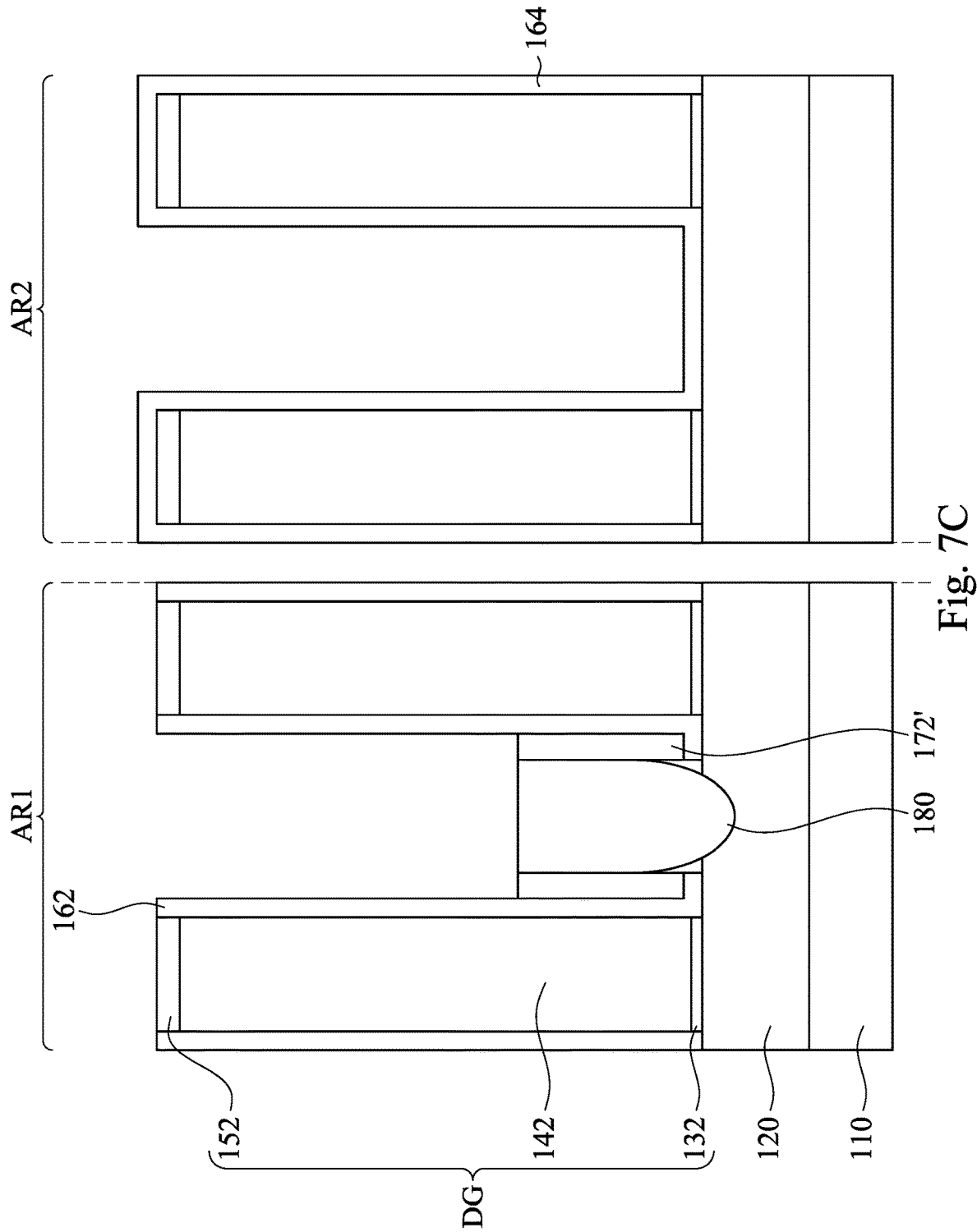

FIGS. 7A-7C illustrate a top view and cross-sectional views of removal of the dummy spacer 172 and the sacrificial spacer layer 174 (referring to FIGS. 6A and 6B). After the formation of the source/drain epitaxial structures 180, an etching back process is performed to remove the dummy spacer 172 and the sacrificial spacer layer 174 (referring to FIGS. 6A and 6B). The gate spacers 162 and the gate spacer layer 164 may have a higher etch resistance to the etching back process than that of the dummy spacers 172 and the sacrificial spacer layer 174 (referring to FIGS. 6A and 6B), and thus not substantially etched during the etching back process. During the etching back process, first portions of the dummy spacers 172 over the semiconductor fin 112 (referring to FIG. 6A) are removed, and second portions of the dummy spacers 172 (referring to FIG. 6B) over the isolation structure 120 are recessed. The recessed second portions of the dummy spacers 172 (referring to FIG. 6B) are denoted as the dummy spacers 172' hereinafter. Each of the dummy spacers 172' may be between the gate spacer 162 and the source/drain epitaxial structures 180, over the isolation structures 120, and has a top end lower than the top surface of the gate structure DG.

Figure 8A:
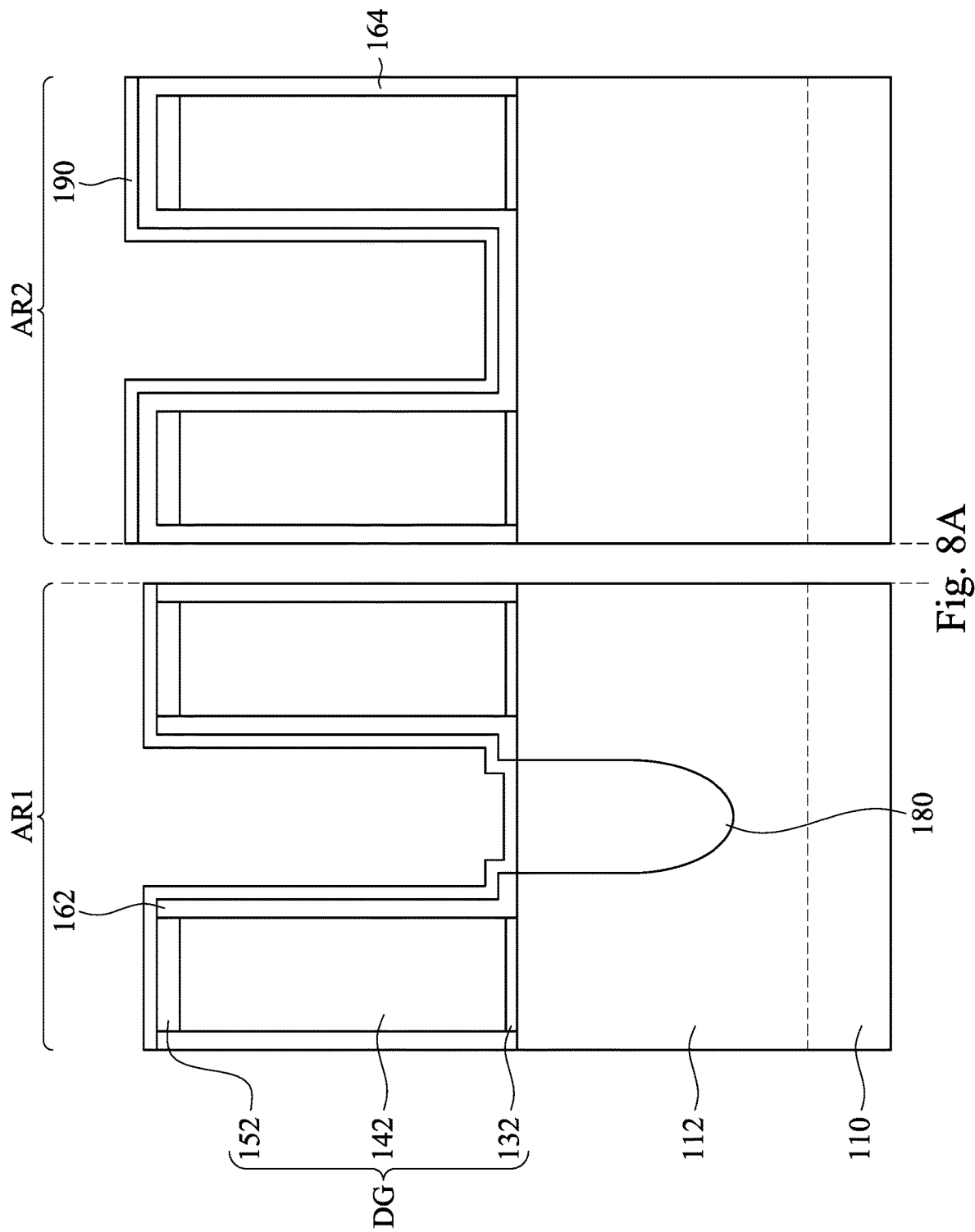
Figure 8B:
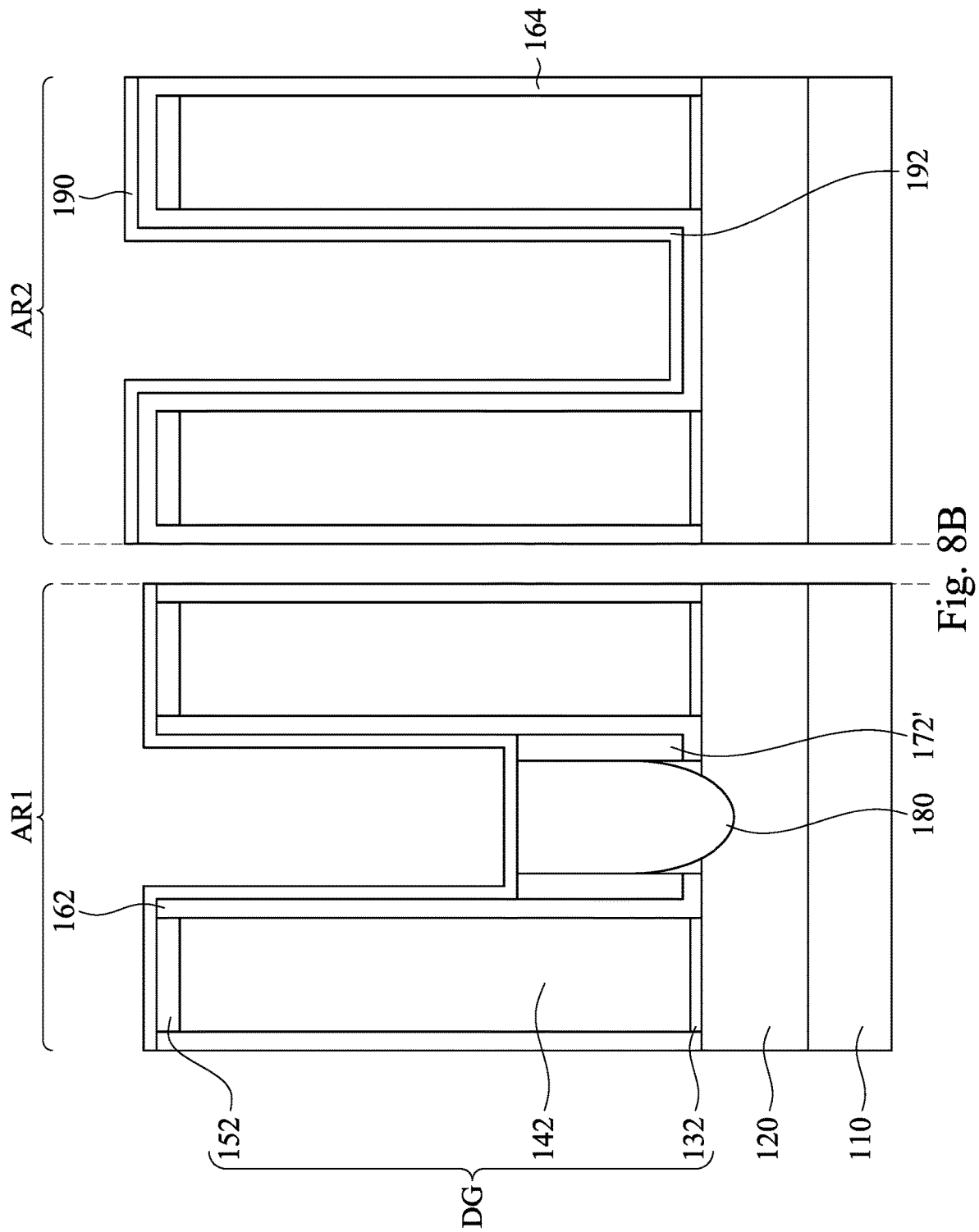

FIGS. 8A and 8B illustrate cross-sectional views of formation of a sacrificial spacer layer 190. The sacrificial spacer layer 190 is conformally deposited over the structure of FIGS. 7B and 7C. The sacrificial spacer layer 190 may have a thickness less than that of the sacrificial spacer layer 170 (referring to FIG. 4B). For example, a difference between a thickness of the sacrificial spacer layer 190 and a thickness of the sacrificial spacer layer 170 (referring to FIG. 4B) is in a range from about 1 nanometer to about 5 nanometers, or a range from about 1 nanometer to about 3 nanometers. If the thickness difference is greater than 5 nanometers, the space may be too small for n-type epitaxial growth, and/or the drain induced barrier lowering (DIBL) for p-type device may become worse. If the thickness difference is less than 1 nanometers, the push proximity at fin top may not improve the junction overlap and epitaxial strain in p-type device. The sacrificial spacer layer 190 may include a different material than that of the gate spacer layer 164, to maintain a suitable etch selectivity between the gate spacer layer 164 and the sacrificial spacer layer 190, and have less chemical influence to subsequent formed epitaxial structures. For example, the sacrificial spacer layer 190 may include SiN, SiCN, SiCON, SiON, $Al_2O_3$, the like, and/or combinations thereof. The sacrificial spacer layer 190 may have a less oxide concentration and/or a less carbon concentration than that of the gate spacer layer 164. In some embodiments, the sacrificial spacer layer 190 may have a higher k value than that of the gate spacer layer 164. For example, the sacrificial spacer layer 190 may have a k value greater than about 5, or even greater than about 6, while the gate spacer layer 164 may have a k value less than about 5.

Stated differently, the sacrificial spacer layer 190 may include a high k dielectric material, while the gate spacer layer 164 may include a low k dielectric material. In some embodiments, the sacrificial spacer layer 190 may include a same material as that of the dummy spacer 172'. In some other embodiments, the sacrificial spacer layer 190 may include a different material from that of the dummy spacer 172'. The sacrificial spacer layer 190 can be deposited by ALD, CVD, the like, or the combination thereof. In some embodiments, the sacrificial spacer layer 190 is deposited with the desired thickness less than that of the sacrificial spacer layer 170 (referring to FIG. 4B). In some embodiments, the sacrificial spacer layer 190 is deposited with a thickness comparable to that of the sacrificial spacer layer 170 (referring to FIG. 4B), and then thinned down by suitable etching process to the desired thickness less than that of the sacrificial spacer layer 170 (referring to FIG. 4B). In the present embodiments, in the region AR1, the sacrificial spacer layer 190 may have a portion over the dummy spacers 172' and the epitaxial structure 180.

Figure 9A:
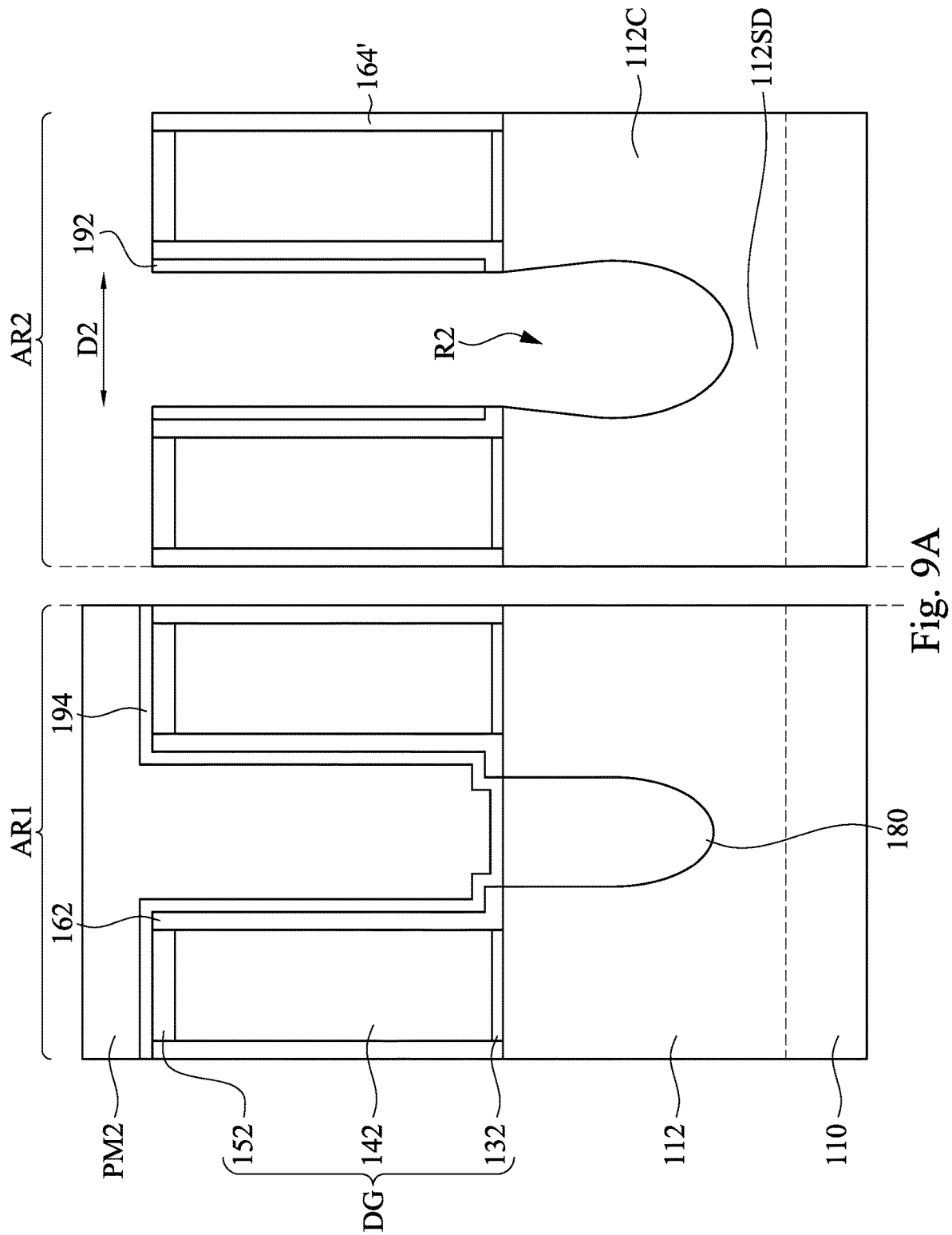
Figure 9B:
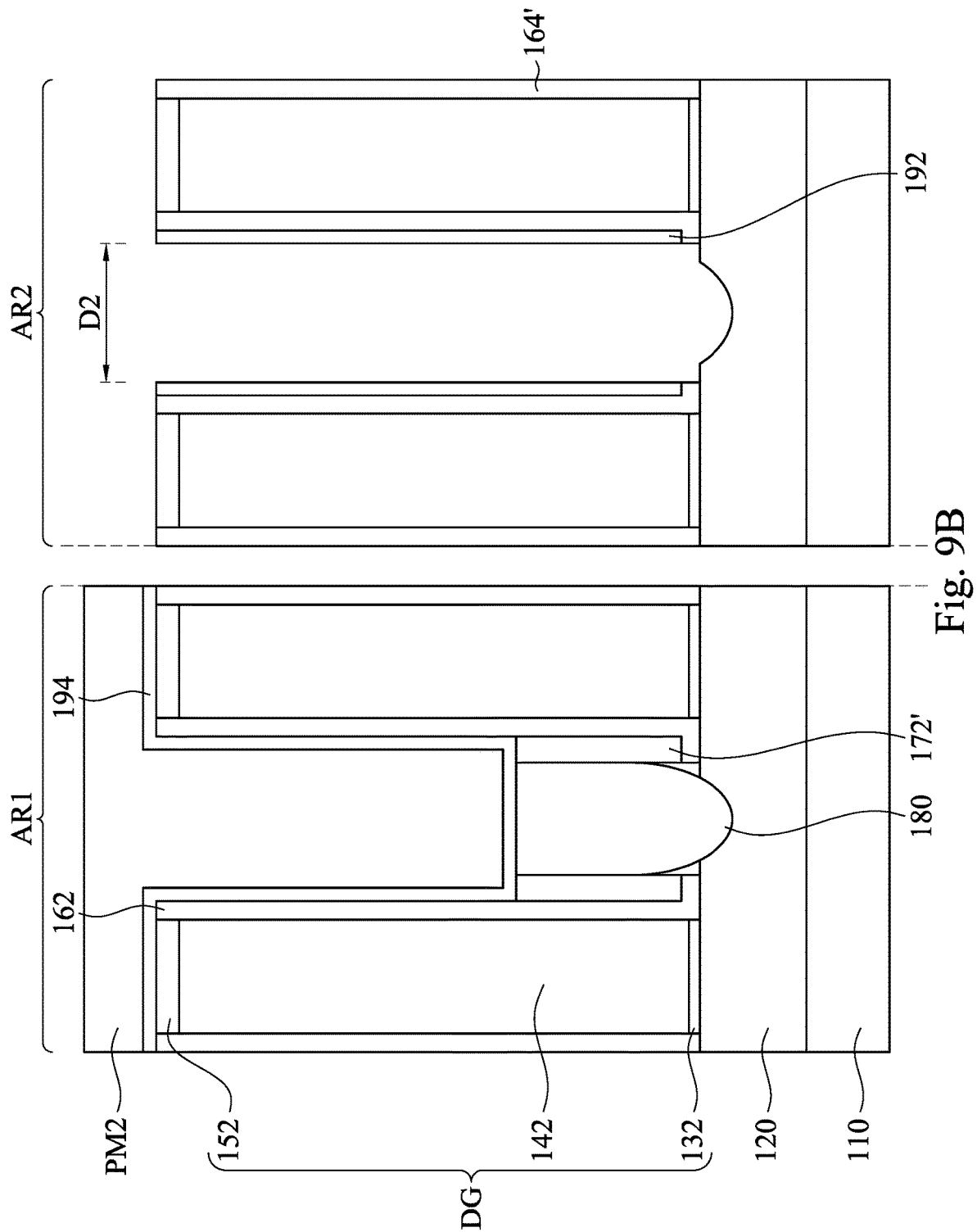

FIGS. 9A and 9B illustrate cross-sectional views of recessing portions of the semiconductor fins 112. A patterned mask PM2 is formed to cover/mask the region AR1 and expose/unmask the region AR2. In some embodiments, the patterned mask PM2 may include a photoresist formed by a photolithography process. An exemplary photolithography process may include processing steps of photoresist coating, soft baking, mask aligning, exposing, post-exposure baking, developing photoresist and hard baking. In some embodiments, the patterned mask PM2 may further include a planarized sacrificial layer below the photoresist. The planarized sacrificial layer, for example, can be an organic material used for the BARC.

With the patterned mask PM2 covering the region AR1, an anisotropic etching process may be performed to etch the sacrificial spacer layer 190 and the gate spacer layer 164 (referring to FIGS. 8A and 8B), thereby exposing regions 112SD of the fins 112 uncovered by the dummy gate structures DG. In the region AR2, this anisotropic etching process may remove horizontal portions of the layers 190 and 164 (referring to FIGS. 8A and 8B) directly above the dummy gate structures DG and horizontal portions of the layers 190 and 164 extending along a top surface of the fins 112. Vertical portions of the layers 190 and 164 (referring to FIGS. 8A and 8B) on sidewalls of the dummy gate structures DG may remain, forming gate spacers, which are respectively denoted as the dummy spacers 192 and the gate spacers 164', for the sake of simplicity. The dummy spacers 192 may be spaced apart from each other by a distance D2, and the regions 112SD exposed by the dummy spacers 192 may have a width substantially equal to the distance D2. In some embodiments of the present disclosure, as a thickness of the dummy spacers 192 is less than a thickness of the dummy spacers 172, the distance D2 (or the width of the regions 112SD exposed by the dummy spacers 192 in the region AR2) is greater than the distance D1 (or the width of the regions 112SD exposed by the dummy spacers 172 in the region AR1). The patterned mask PM2 may protect a portion of the sacrificial spacer layer 190 (referring to FIG. 8B) in the region AR1 from the anisotropic etching process. Thus, the portion of the sacrificial spacer layer 190 (referring to FIG. 8B) in the region AR1 may remain as a spacer layer, which are respectively denoted as the spacer layer 194, for the sake of simplicity.

After the formation of the dummy spacers 192 and the gate spacers 164', portions of the semiconductor fins 112 uncovered by the dummy gate structures DG and the dummy spacers 192 and the gate spacers 164' in the region AR2 are removed, such that each of the remaining semiconductor fins 112 in the region AR2 include a recessed region 112SD uncovered by the dummy gate structures DG and a channel region 112C covered by the dummy gate structures DG, respectively. Through the removal, a plurality of recesses R2 are formed in the semiconductor fins 112 of the substrate 110. The removal of the semiconductor fins 112 may include one or more etching process. The etching process may include dry etch, wet etch, or the combination thereof. The dry etching processes may include a biased plasma etching process that uses a fluorine-based chemistry (e.g., $CF_4$, $SF_6$, $CH_2F_2$, $CHF_3$, and/or $C_4F_8$). Dry etching may also be performed anisotropically using such mechanisms as DRIE (deep reactive-ion etching). The anisotropic etching process may result in little lateral etching. In some embodiments, the spacers 192 and 164' and the patterned mask 152 may have a higher etch resistance to the etching process, thereby serve as etch masks during recessing the regions 112SD of the semiconductor fins 112. The patterned mask PM2 may protect the region AR1 from being damaged during these etching processes. After these etching processes, the patterned mask PM2 can be removed by suitable stripping or ashing process.

Figure 10A:
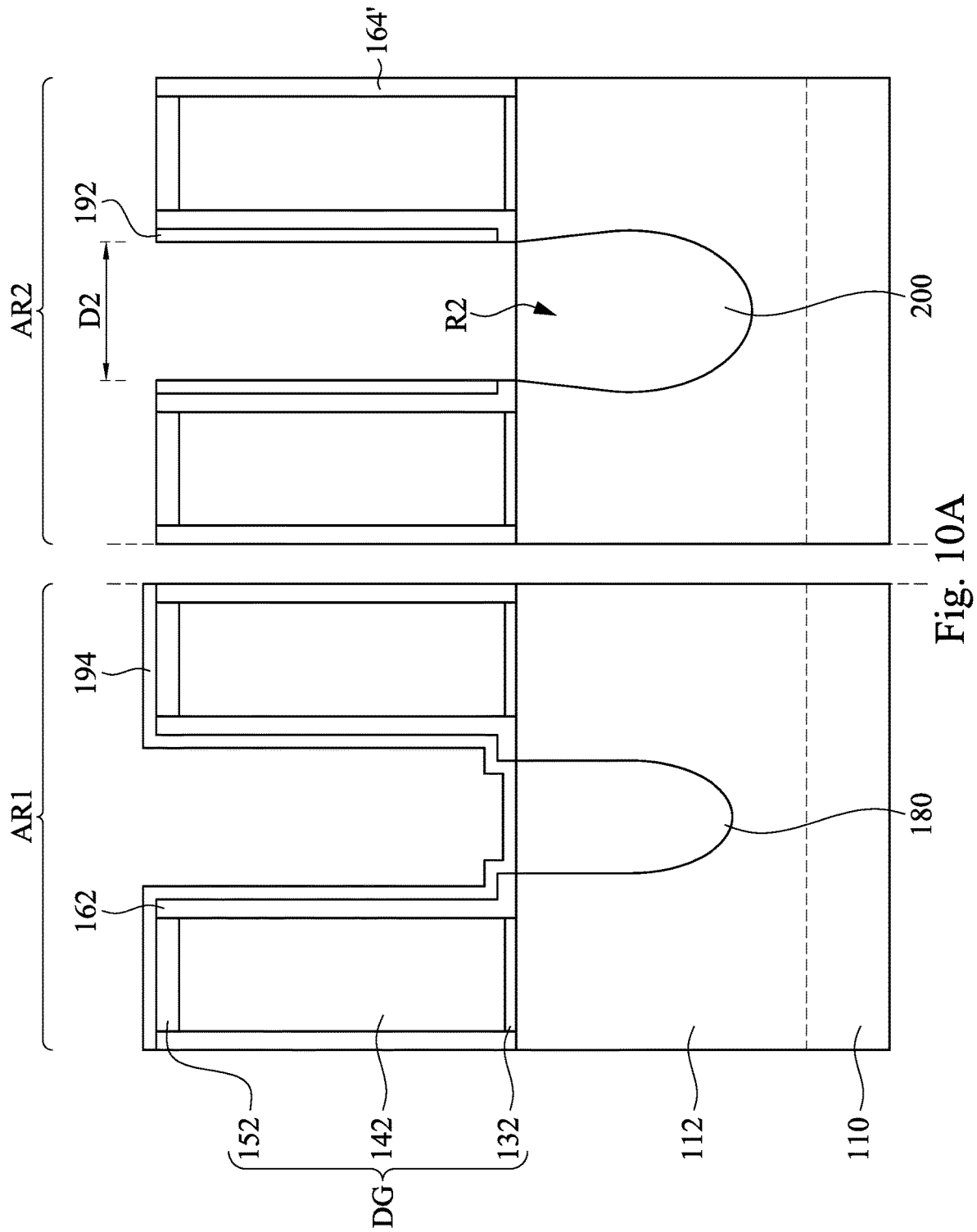
Figure 10B:
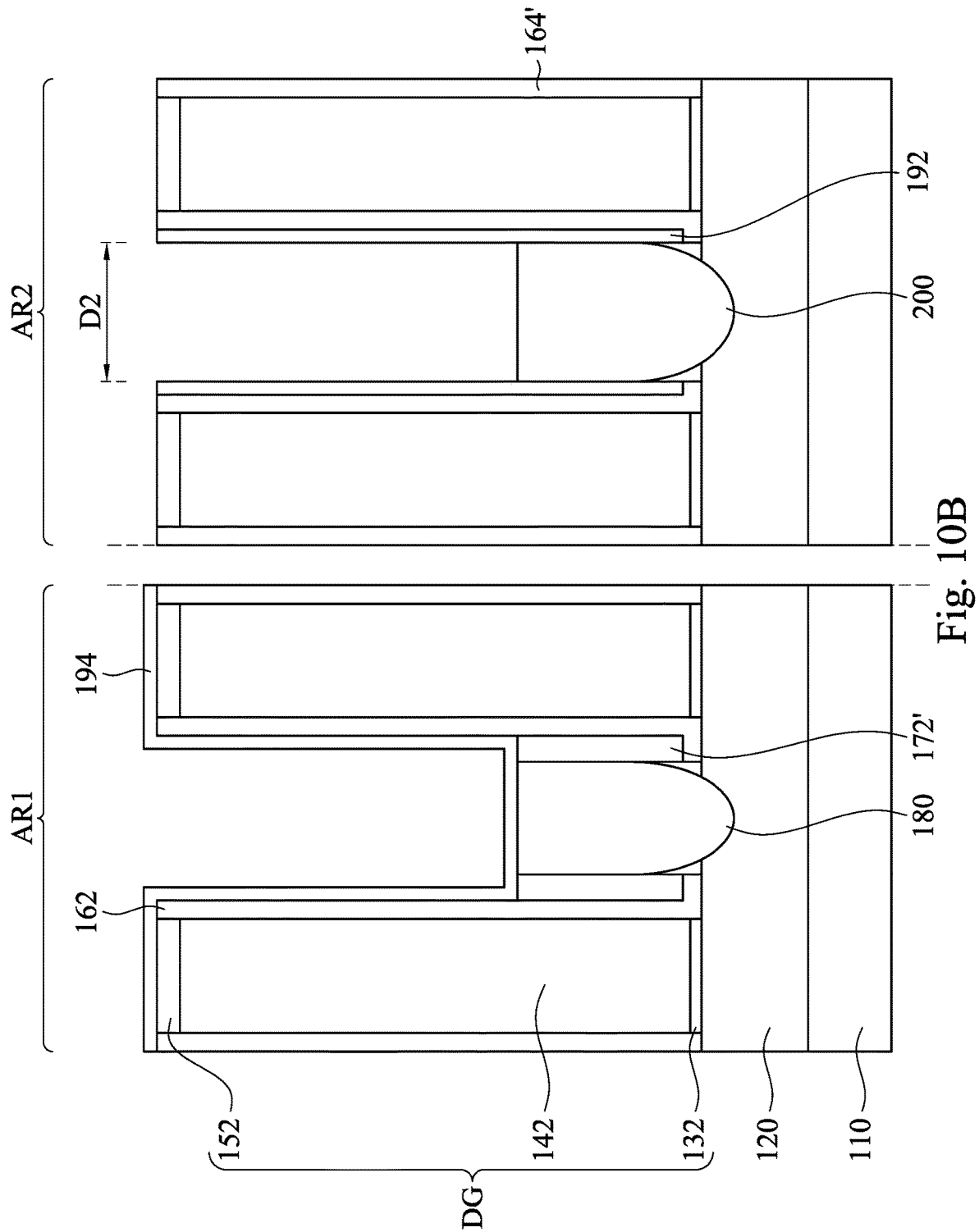
Figure 10C:
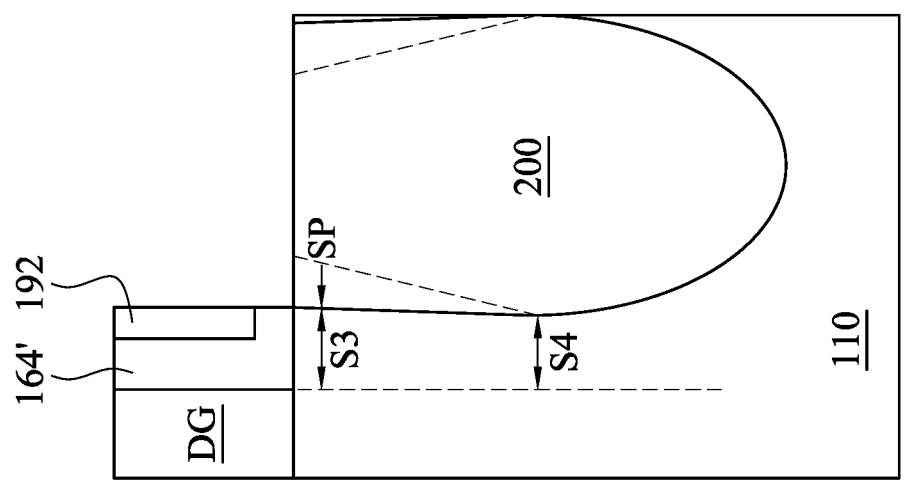

FIGS. 10A and 10B illustrate cross-sectional views of formation of a source/drain epitaxial structure 200. A source/drain epitaxial structure 200 is formed in the recesses R2 in the semiconductor fins 112 and between the dummy gate structures DG. In some embodiments, the source/drain epitaxial structure 200 may also be referred to as a epitaxy feature. The source/drain epitaxial structure 200 may be formed using one or more epitaxy or epitaxial (epi) processes, such that one or more semiconductor materials can be formed in a crystalline state on the semiconductor fins 112. In some embodiments, a lattice constant of the source/drain epitaxial structure 200 is different from a lattice constant of the semiconductor fin 112, such that channels in the channel regions 112C of the semiconductor fins 112 are strained or stressed to enable carrier mobility of the semiconductor device and enhance the device performance. In some embodiments, the source/drain epitaxial structure 200 is a p-type epitaxial structure, which may include a suitable semiconductor material, such as germanium (Ge) or silicon (Si); or compound semiconductor materials, such as silicon germanium (SiGe). In some other embodiments, the source/drain epitaxial structure 200 is a n-type epitaxial structure, which may include a suitable n-type semiconductor material, such as germanium (Ge) or silicon (Si); or compound semiconductor materials, such as silicon carbide (SiC). In some embodiments, the source/drain epitaxial structures 200 may include one or plural epitaxial layers, in which the plural epitaxial layers may have different compositions.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112 (e.g., silicon). The source/drain epitaxial structure 200 may be in-situ doped. The doping species include p-type dopants, such as boron or $BF_2$, for the p-type source/drain epitaxial structure 200. In some other embodiments where the source/drain epitaxial structure 200 is an n-type source/drain epitaxial structure, doping species include n-type dopants, such as phosphorus or arsenic. If the source/drain epitaxial structure 200 is not in-situ doped, a second implantation process (i.e., a junction implant process) is performed to dope the source/drain epitaxial structure 200. One or more annealing processes may be performed to activate the source/drain epitaxial structure 200. The annealing processes include rapid thermal annealing (RTA) and/or laser annealing processes.

In some embodiments of the present disclosure, depending on the dopant diffusivity of the source/drain epitaxial structures 180/200, dummy spacers, which limits the space for source/drain epitaxial growth, are designed with different thicknesses. The source/drain epitaxial structures 200 may have a dopant diffusivity less than a dopant diffusivity of the source/drain epitaxial structures 180, and the dummy spacers 192 are designed to be thinner than the dummy spacers 172. For example, a diffusivity of p-type dopants (e.g., boron) in the p-type source/drain epitaxial structures 200 (e.g., SiGe) may be less than of a diffusivity of n-type dopants (e.g., phosphorus) in the n-type source/drain epitaxial structures 180 (e.g., Si), and the dummy spacers 192 are thinner than the dummy spacers 172. For example, a diffusivity of born in SiGe is 1/10 of a diffusivity of phosphoru in Si. Through the design, the p-type source/drain epitaxial structures 200 (e.g., SiGe) fabricated using the thinner dummy spacers 192 may have more proximity push, especially at fin top, than the source/drain epitaxial structures 180 (e.g., Si) fabricated using the thicker dummy spacers 172 (referring to FIGS. 6A-6C), thereby improving the junction overlap. The larger size of the p-type source/drain epitaxial structure 200 may be beneficial for epitaxial strain. As the n-type dopants (e.g., phosphorus) in the n-type source/drain epaxial structures 180 (e.g., Si) have a greater diffusivity than the p-type dopants (e.g., boron) in the p-type source/drain epitaxial structures 200 (e.g., SiGe), thick dummy spacers are designed for DIBL in short channel control of the n-type device.

In some other embodiments where the source/drain epitaxial structures 180 and 200 are both n-type source/drain epitaxial structures, a diffusivity of n-type dopants (e.g., phosphorus) in the n-type source/drain epitaxial structures 200 (e.g., Si) may be less than of a diffusivity of n-type dopants (e.g., phosphorus) in the n-type source/drain epitaxial structures 180 (e.g., Si), and the dummy spacers 192 are thinner than the dummy spacers 172. For example, the n-type source/drain epitaxial structures 200 (e.g., Si) may be fabricated using the thinner dummy spacers 192, and the n-type source/drain epitaxial structures 180 (e.g., Si) may be fabricated using the thicker dummy spacers 172.

In some other embodiments where the source/drain epitaxial structures 180 and 200 are both p-type source/drain epitaxial structures, a diffusivity of p-type dopants (e.g., boron) in the p-type source/drain epitaxial structures 200 (e.g., SiGe) may be less than of a diffusivity of p-type dopants (e.g., boron) in the p-type source/drain epitaxial structures 180 (e.g., SiGe), and the dummy spacers 192 are thinner than the dummy spacers 172. For example, the p-type source/drain epitaxial structures 200 (e.g., SiGe) may be fabricated using the thinner dummy spacers 192, and the p-type source/drain epitaxial structures 180 (e.g., SiGe) may be fabricated using the thicker dummy spacers 172.

In some other embodiments where the source/drain epitaxial structure 180 is a p-type source/drain epitaxial structure and the source/drain epitaxial structures 200 is n-type source/drain epitaxial structures, a diffusivity of n-type dopants (e.g., phosphorus) in the n-type source/drain epitaxial structures 200 (e.g., Si) may be less than of a diffusivity of p-type dopants (e.g., boron) in the p-type source/drain epitaxial structures 180 (e.g., SiGe), and the dummy spacers 192 are thinner than the dummy spacers 172. For example, the n-type source/drain epitaxial structures 200

(e.g., Si) may be fabricated using the thinner dummy spacers 192, and the p-type source/drain epitaxial structures 180 (e.g., SiGe) may be fabricated using the thicker dummy spacers 172.

FIG. 10C is an enlarged view of a portion of the semiconductor device in FIG. 10A. The source/drain epitaxial structure 200 is offset from a sidewall of the dummy gate structure DG by the spacers 164' and 192. In FIG. 10C, distances from a sidewall of the p-type source/drain epitaxial structure 200 to the sidewall of the gate structure (e.g., dummy gate structures DG) are indicated as distances S3 and S4 at a surface (or fin top) and middle positions, respectively. In FIG. 10C, the dashed line in the p-type source/drain epitaxial structure 200 indicates a profile of a p-type source/drain epitaxial structure using thick dummy spacers, for example, the same as the dummy spacers 172 (referring to FIG. 6C). By using the thin dummy spacers 192, the p-type source/drain epitaxial structure 200 may have an effective proximity push at fin top (or surface junction push), which is indicated as a distance SP. For example, a combination of the distance SP and the distance S3 may be substantially equal to the distance S1 (referring to FIG. 6C). For the p-type device, the effective proximity push at fin top (e.g., the distance SP) can improve the short channel control by tri-gate structure. Also, the proximity push at fin top (e.g., the distance SP) can lower the channel resistance and the parasitic resistance for the p-type device, thereby boosting the device drain current (DC) gain. For example, the distance S3 in the region AR2 is less than the distance S1 in the region AR1. By controlling the etching of the recess R2 (referring to FIGS. 9A and 9B)(e.g., using anisotropic etching for vertical etching and less isotropic etching for lateral etching), the proximity push, at middle and bottom, (e.g., the distance S4), may remain for DIBL in short channel control for the p-type device. For example, the distance S4 may be less than the distance S2 (referring to FIG. 6C), and a difference between the distances S3 and S1 is greater than a distance between the distances S4 and S2.

In some cases, the device has a small opening/space between dummy spacer for the epitaxial growth, epitaxial nodule may remain on sidewalls of dielectric materials (e.g., the sacrificial/dummy spacers). The epitaxial nodule defects may induce source/drain line broken and thus yield loss. The epitaxial nodule is further worse with technology scaling due to the smaller opening space between dummy spacer.

In some embodiments of the present disclosure, as the width of the regions 112SD exposed by the dummy spacers 192 in the region AR2 (e.g., the distance D2) is greater than the width of the regions 112SD exposed by the dummy spacers 172 in the region AR1 (e.g., the distance D1), a width of the p-type source/drain epitaxial structure 200 is greater than a width of the n-type source/drain epitaxial structure 180. Compared to the n-type epitaxial growth in the region AR1, the p-type epitaxial growth in the region AR2 have a larger opening/space, thereby having less epaxial nodule and less selectivity loss.

Figure 11A:
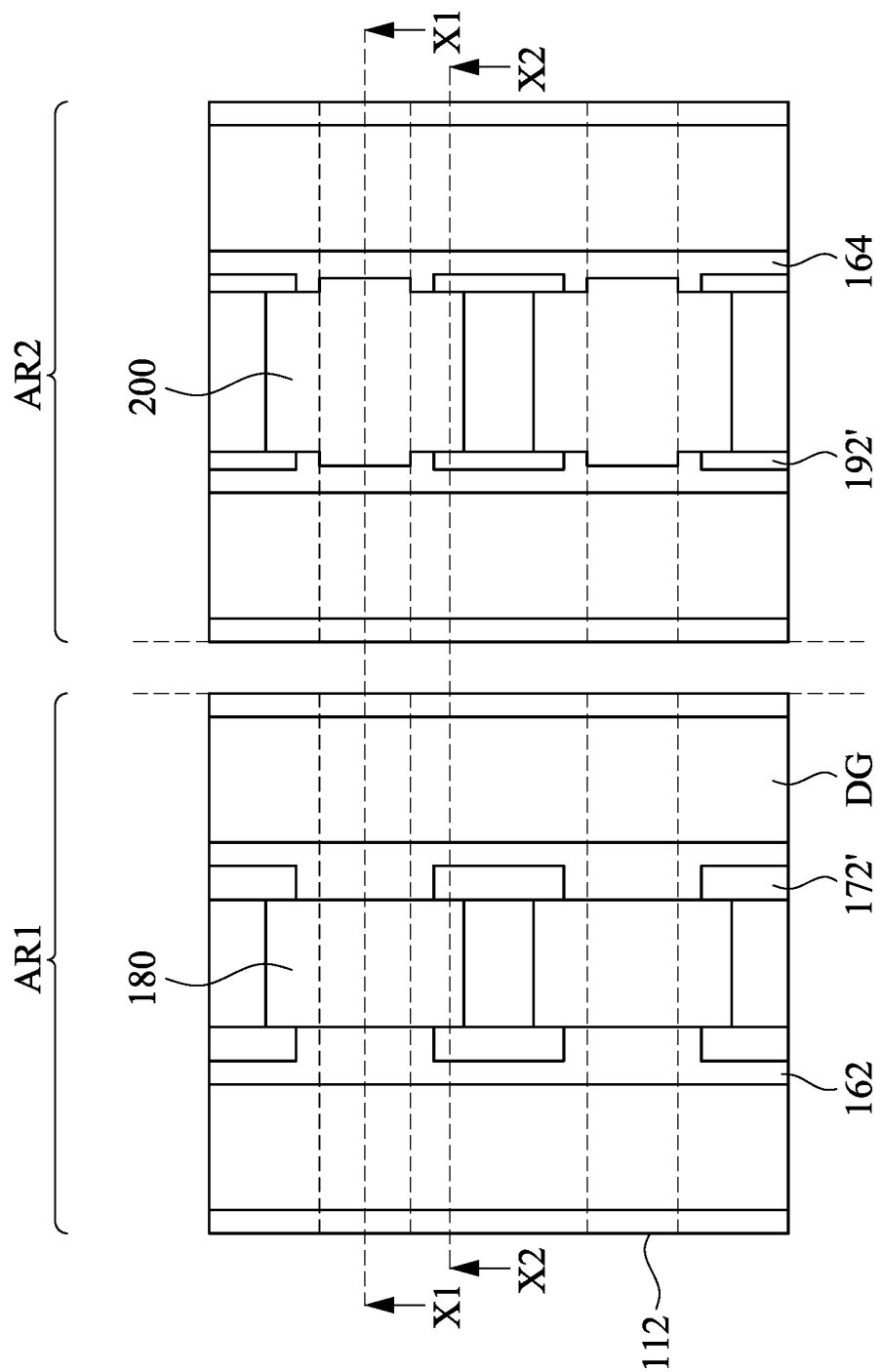
Figure 11B:
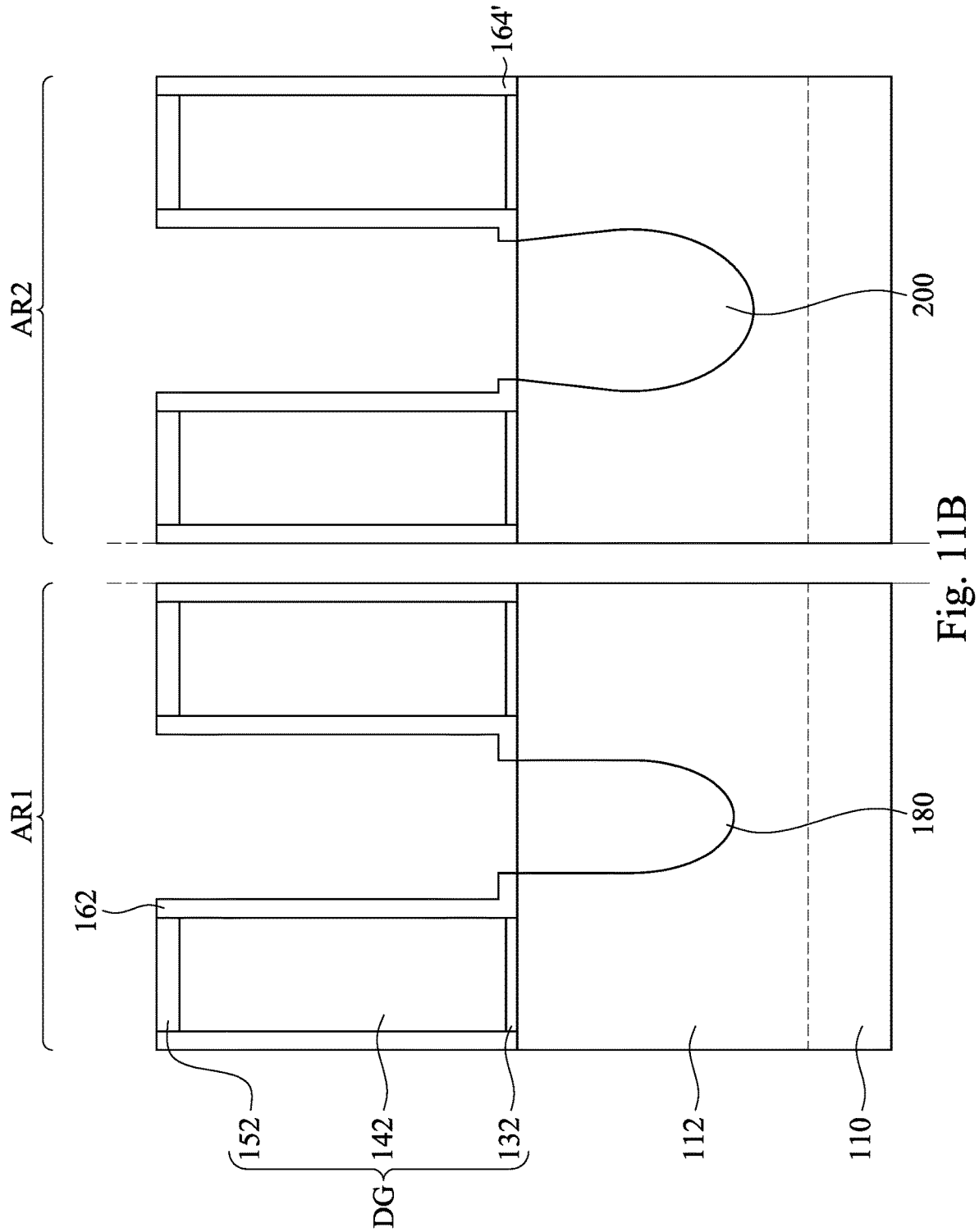
Figure 11C:
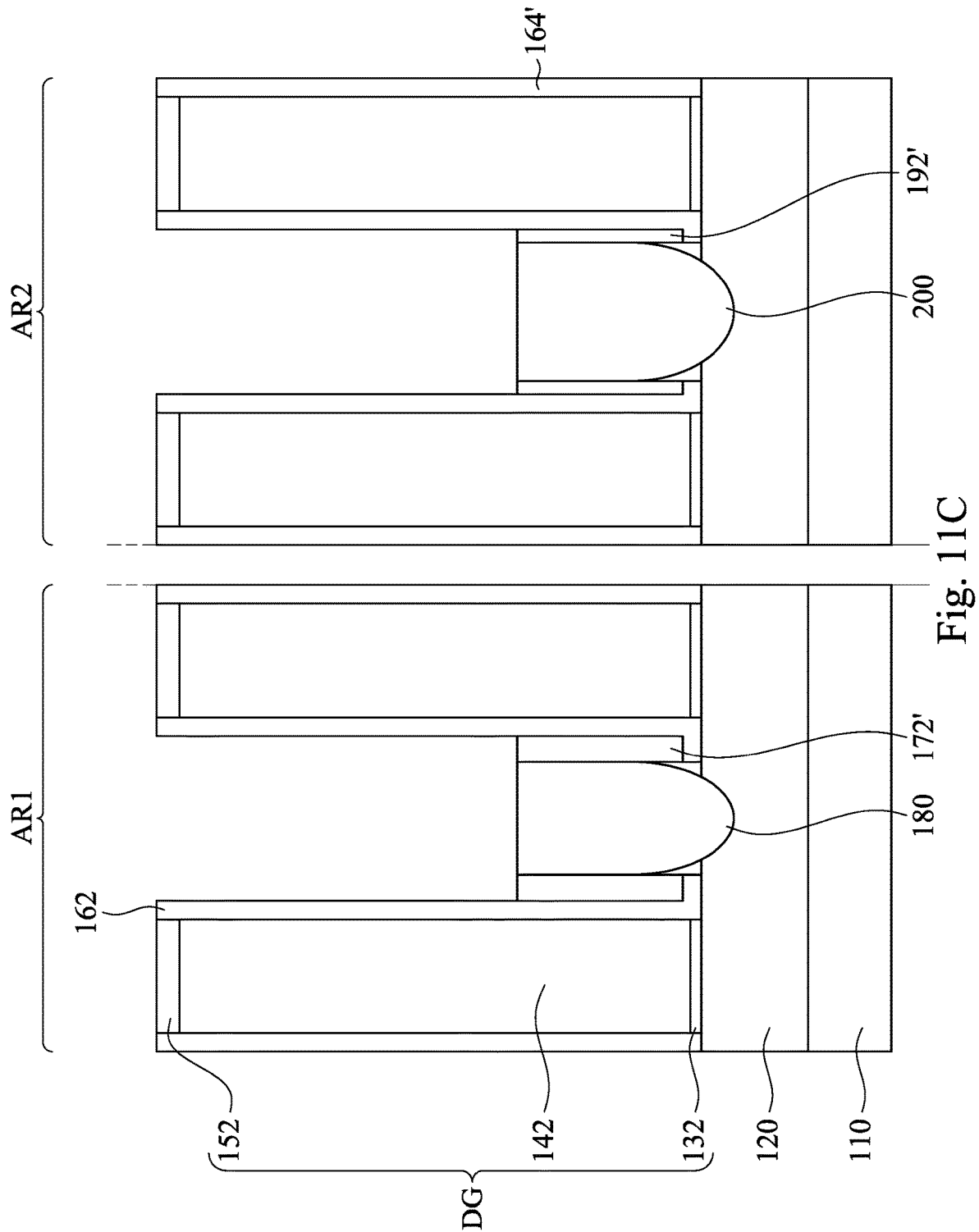

FIGS. 11A-11C illustrate a top view and cross-sectional views of removal of the sacrificial gate spacer 194 (referring to FIGS. 10A and 10B). After the formation of the source/drain epitaxial structures 200, an etching back process is performed to remove the dummy spacer 192 and the sacrificial spacer layer 194 (referring to FIGS. 10A and 10B). The gate spacers 162 and 164' may have a higher etch resistance to the etching back process than that of the dummy spacer 192 and the sacrificial spacer layer 194 (referring to FIGS. 10A and 10B), and thus not substantially etched during the etching back process. During the etching back process, first portions of the dummy spacers 192 over the semiconductor fin 112 (referring to FIGS. 10A and 10B) are removed, and second portions of the dummy spacers 192 (referring to FIGS. 10A and 10B) over the isolation structure 120 are recessed. The recessed second portions of the dummy spacers 192 (referring to FIGS. 10A and 10B) are denoted as the dummy spacers 192' hereinafter. Each of the dummy spacers 192' may be between the gate spacer 162 and the source/drain epitaxial structures 200, over the isolation structures 120, and has a top end lower than the top surface of the gate structure DG.

In some embodiments, the formation of the source/drain epitaxial structure having a greater dopant diffusivity can be performed before the formation of the source/drain epitaxial structure having a less dopant diffusivity. In the illustrated embodiments where the diffusivity of p-type dopants in the p-type source/drain epitaxial structures 200 is less than of the diffusivity of n-type dopants in the n-type source/drain epitaxial structures 180, the formation of the n-type source/drain epitaxial structure 180 and remaining the dummy spacer 172' in the region AR1 (as described in FIGS. 4A-7C) is performed prior to the formation of the p-type source/drain epitaxial structure 200 and remaining the dummy spacer 192' in the region AR2 (as described in FIGS. 8A-11C). Through the sequence, the formation and the removal of the thick dummy spacer (referring to FIGS. 7A-7C) is performed prior to the formation and the removal of the thin dummy spacer (referring to FIGS. 11A-11C), which may reduce the damage to epitaxial structures due to the removals of the thick dummy spacer. In some alternative embodiments, the formation of the source/drain epitaxial structure having a greater dopant diffusivity (referring to FIGS. 7A-7C) can be performed after the formation of the source/drain epitaxial structure having a less dopant diffusivity (referring to FIGS. 11A-11C). Through the sequence, the formation and the removal of the thick dummy spacer (referring to FIGS. 7A-7C) may be performed after the formation and the removal of the thin dummy spacer (referring to FIGS. 11A-11C).

Figure 12A:
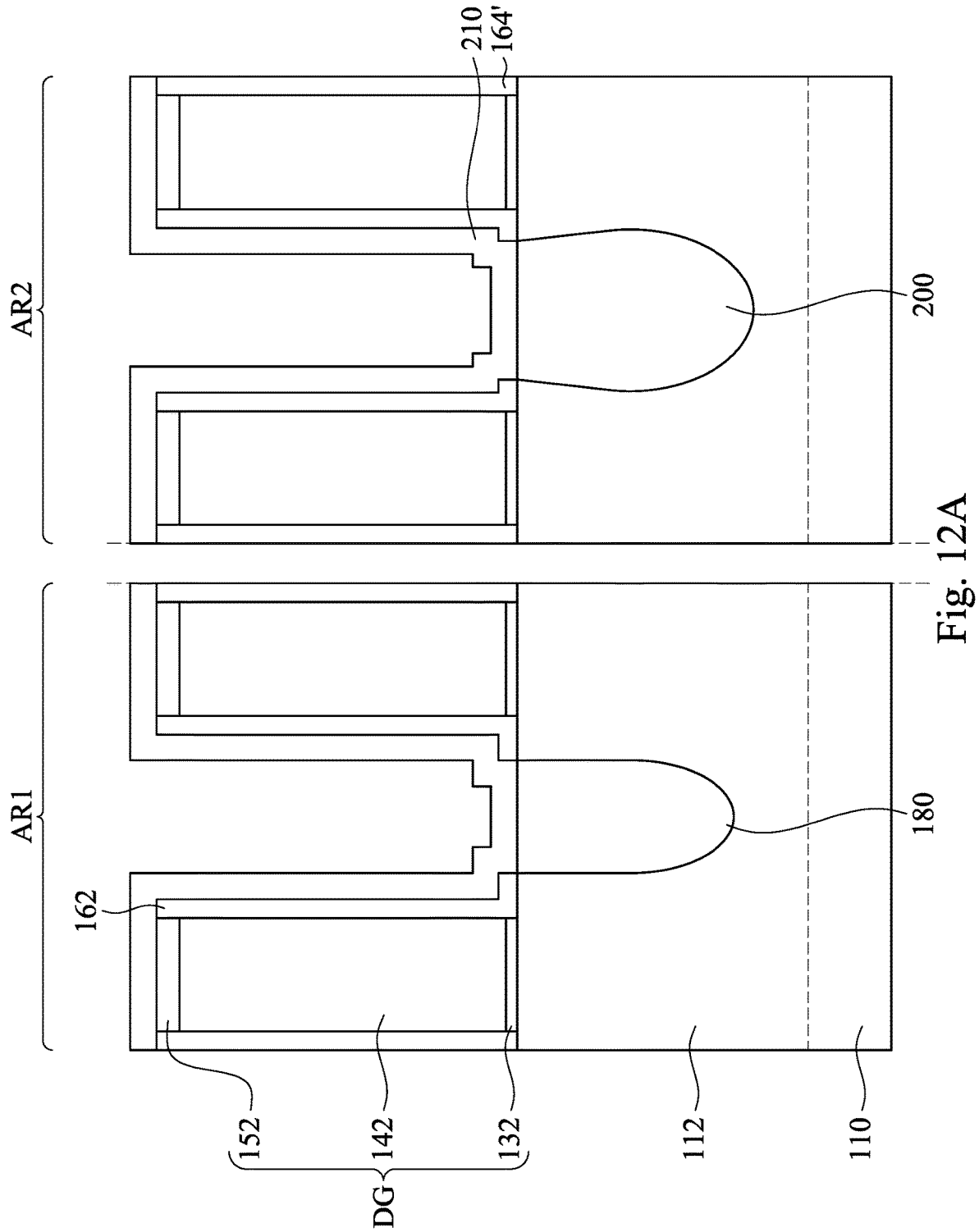
Figure 12B:
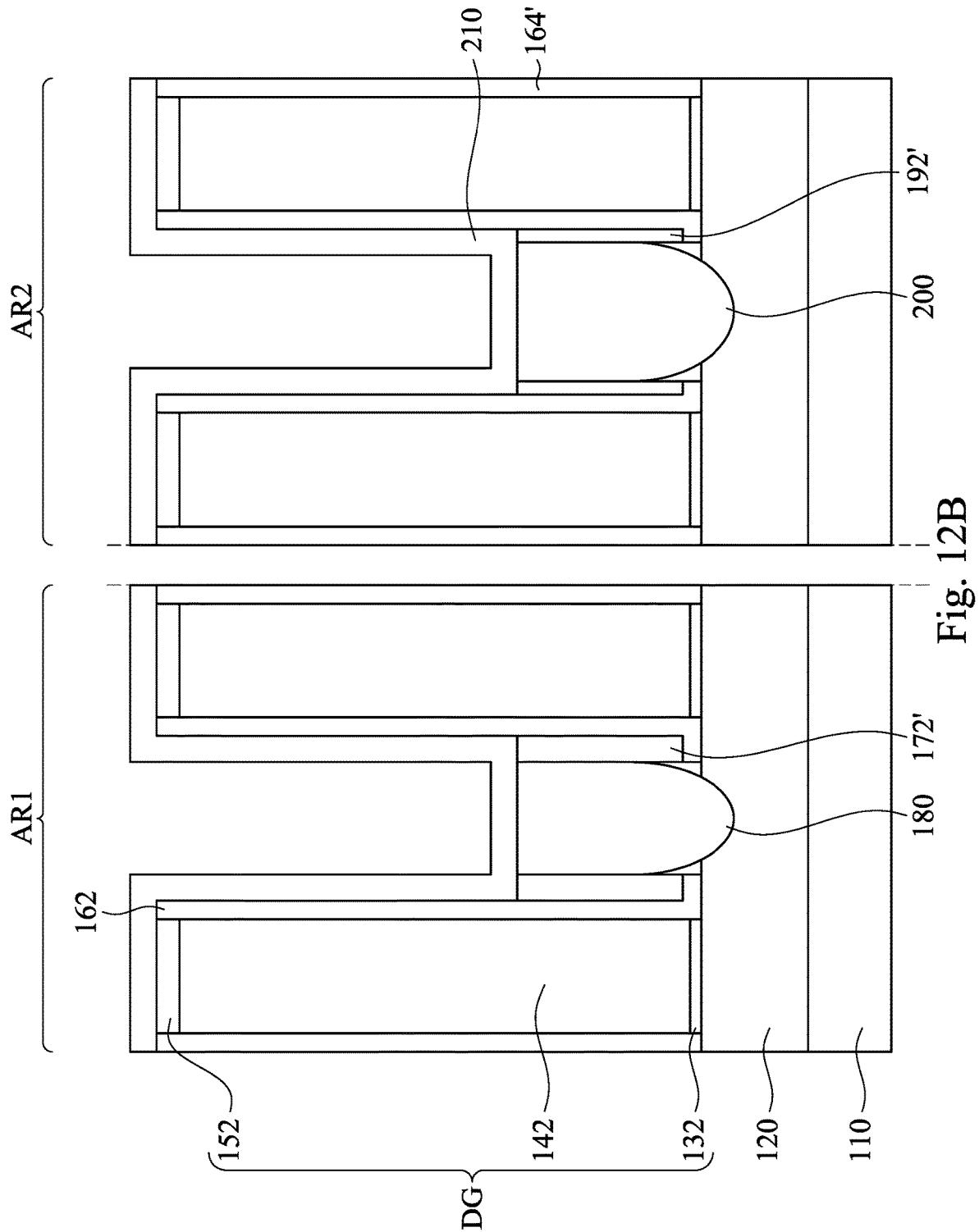
Figure 12D:
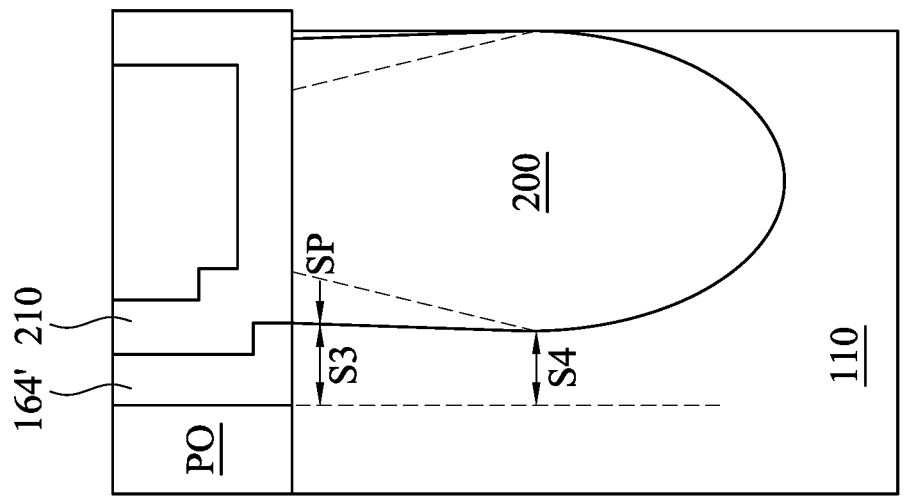
Figure 12C:
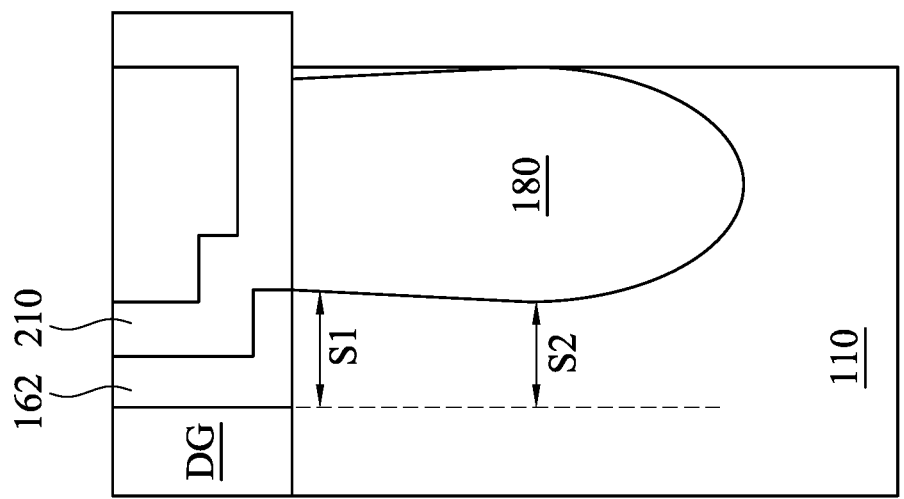

FIGS. 12A and 12B illustrate cross-sectional views of formation of a contact etch stop layer (CESL). In some embodiments, after the source/drain epitaxial structures 200 are formed, a CESL 210 may be blanket formed over the substrate 110 and surrounding the source/drain epitaxial structures 180 and 200. The CESL 210 may be deposited over the source/drain epitaxial structures 180 and 200 and the dummy spacers 172' and 192'. In some examples, the CESL 210 includes suitable dielectric materials, such as SiN, SiC, SiCN, SiON, the like, or combinations thereof. The CESL 210 may be deposited using chemical vapor deposition (CVD), high density plasma (HDP) CVD, sub-atmospheric CVD (SACVD), molecular layer deposition (MLD), sputtering, physical vapor deposition (PVD), plating, or other suitable techniques. The CESL 210 may have a higher k value than that of the gate spacers 162 and 164'. For example, the CESL 210 may have a k value greater than about 5, while the gate spacers 162 and 164' may have a k value less than about 5. Stated differently, the CESL 210 may include a high k dielectric material, while the gate spacers 162 and 164' may include a low k dielectric material. In some embodiments, the CESL 210 may include a same material as that of the dummy spacer 172'/192'. In some other embodiments, the CESL 210 may include a different material from that of the dummy spacer 172'/192'. For example, the k value of the CESL 210 may be greater or lower than that of the dummy spacer 172'/192'. The CESL 210 may have a suitable thickness for device gate-to-contact capacitance and outer fringe capacitance.

FIGS. 12C and 12D are enlarged view of portions of the semiconductor device in FIG. 12A. As aforementioned, the dashed line in the p-type source/drain epitaxial structure 200 indicates a profile of a p-type source/drain epitaxial structure using thick dummy spacers. By using the thin dummy spacers, the p-type source/drain epitaxial structure 200 may have an effective proximity push at fin top, which is indicated as a distance SP. With the proximity push at fin top, the distance S3 may be less than the distance S1, the distance S4 may be less than the distance S2, and a difference between the distances S3 and S1 is greater than a distance between the distances S4 and S2.

Figure 13A:
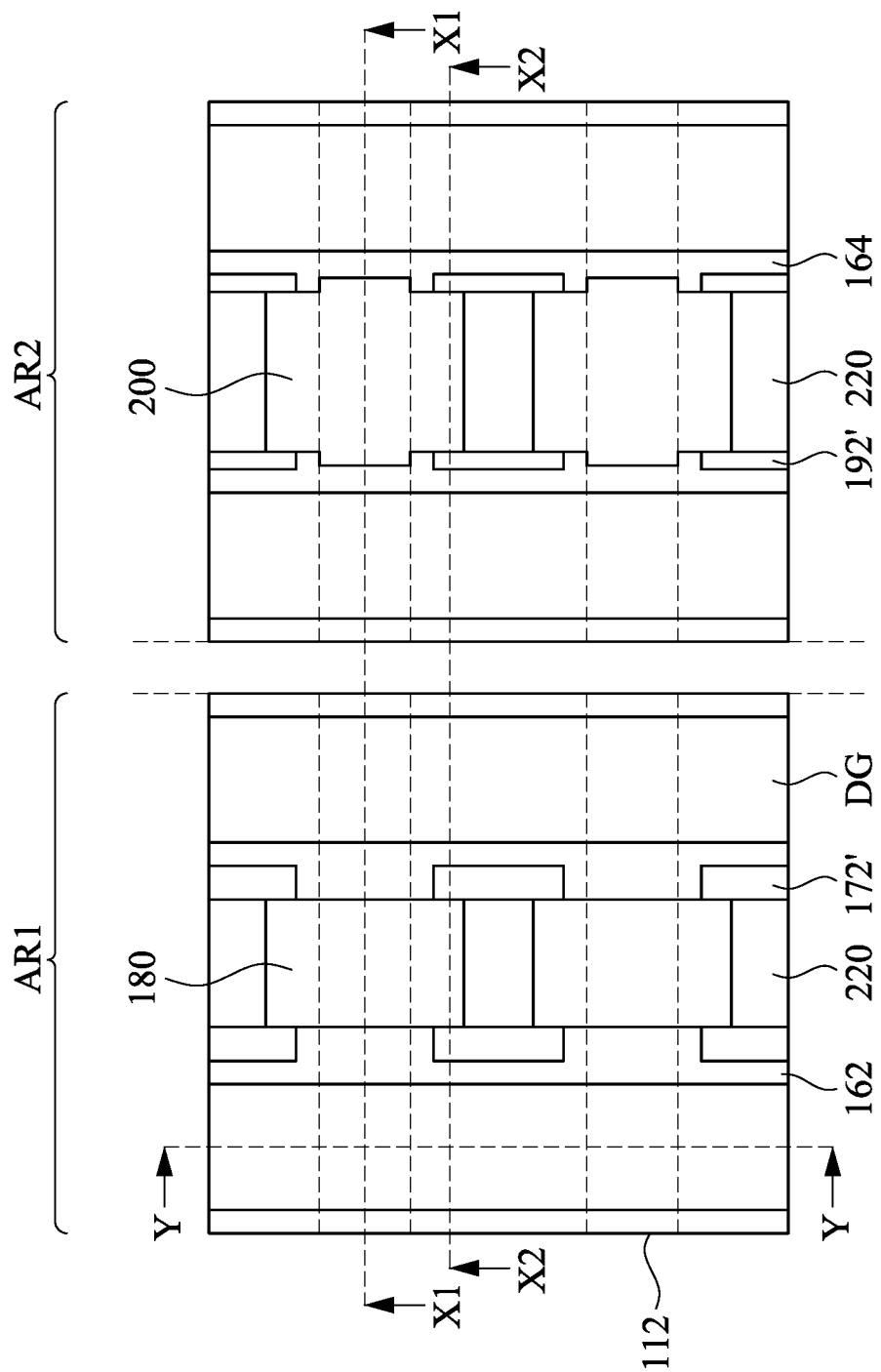
Figure 13B:
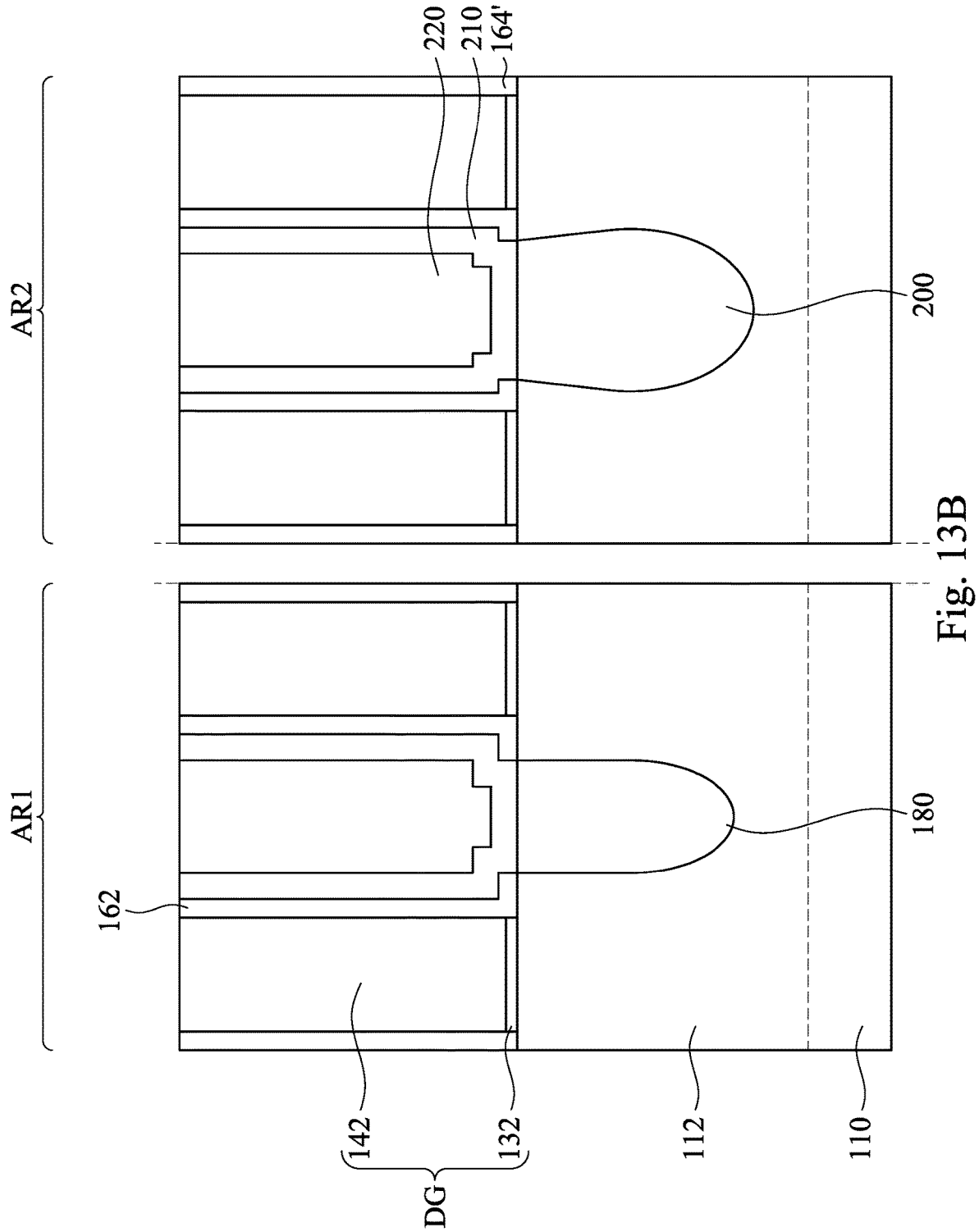
Figure 13C:
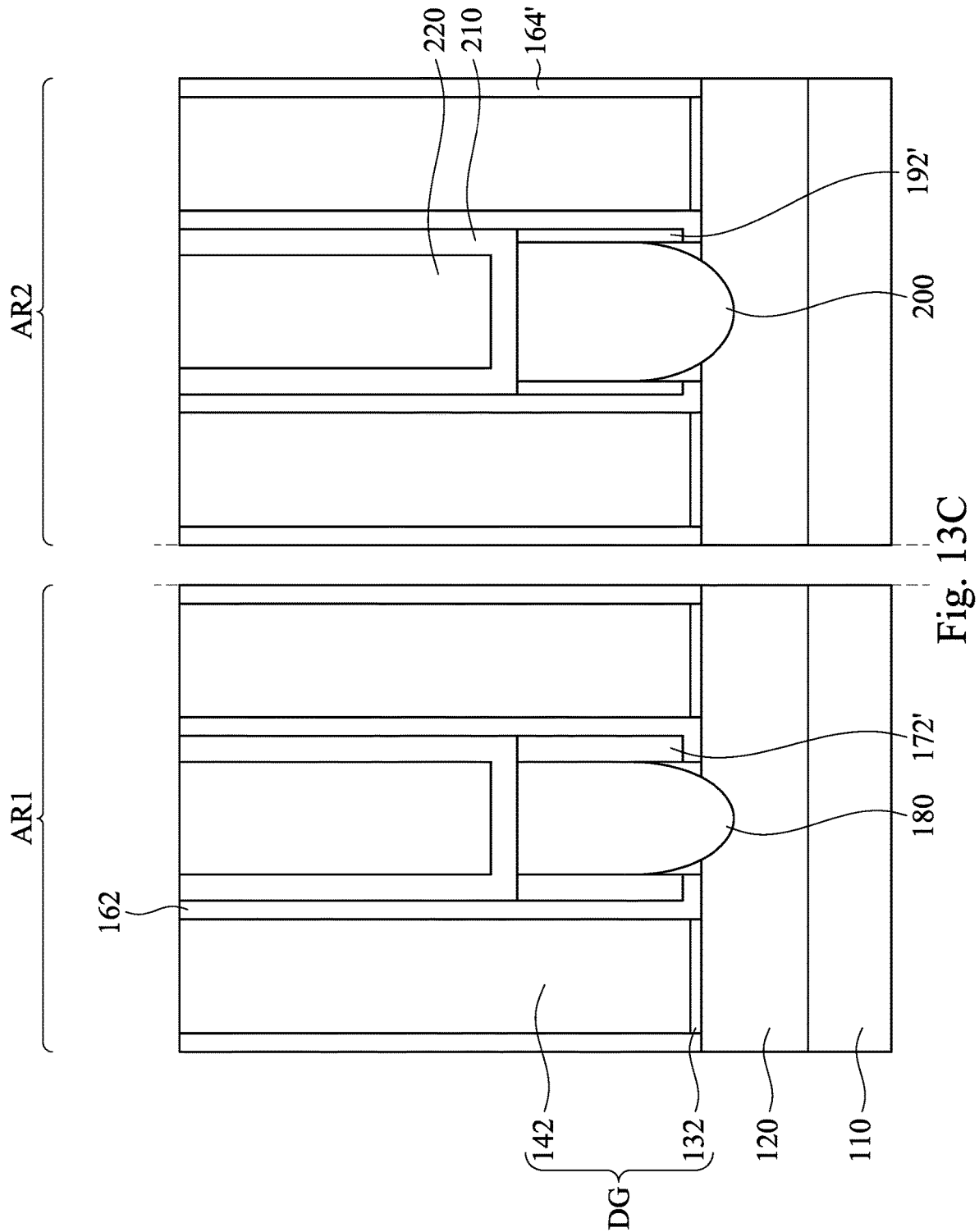
Figure 14A:
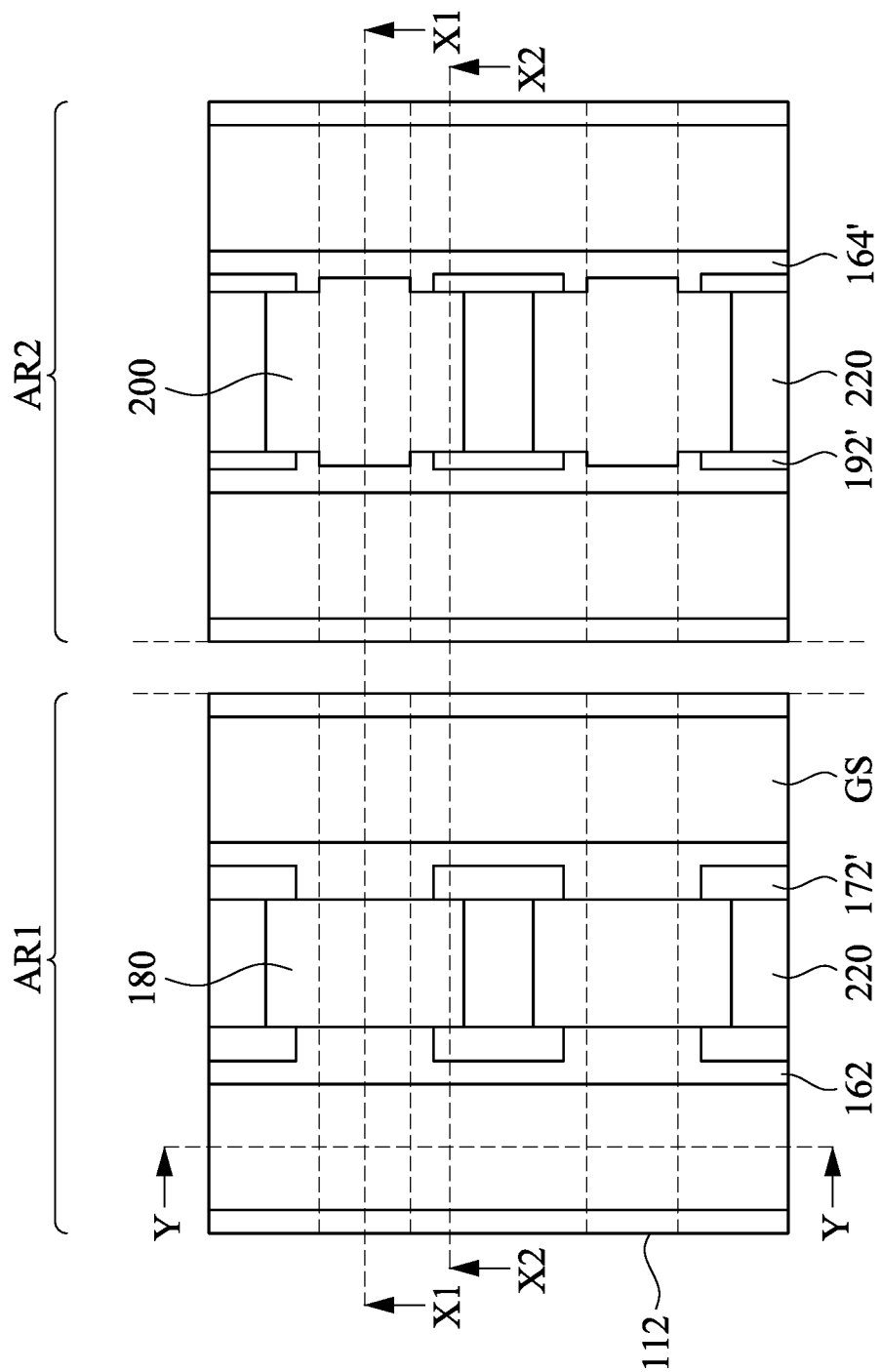
Figure 14B:
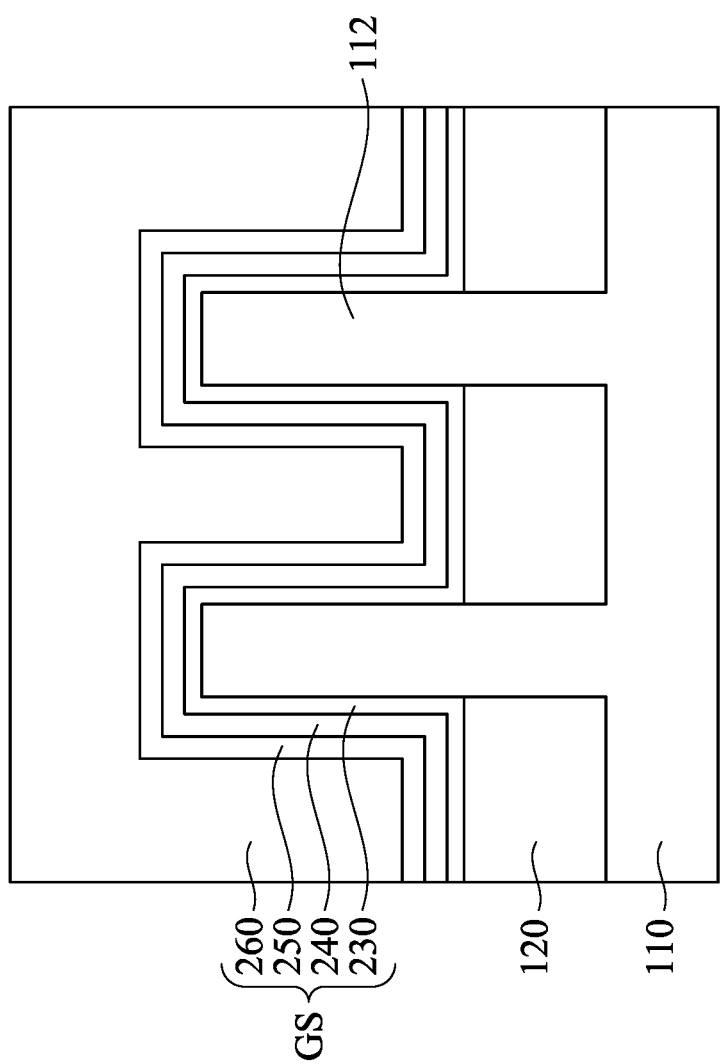
Figure 14C:
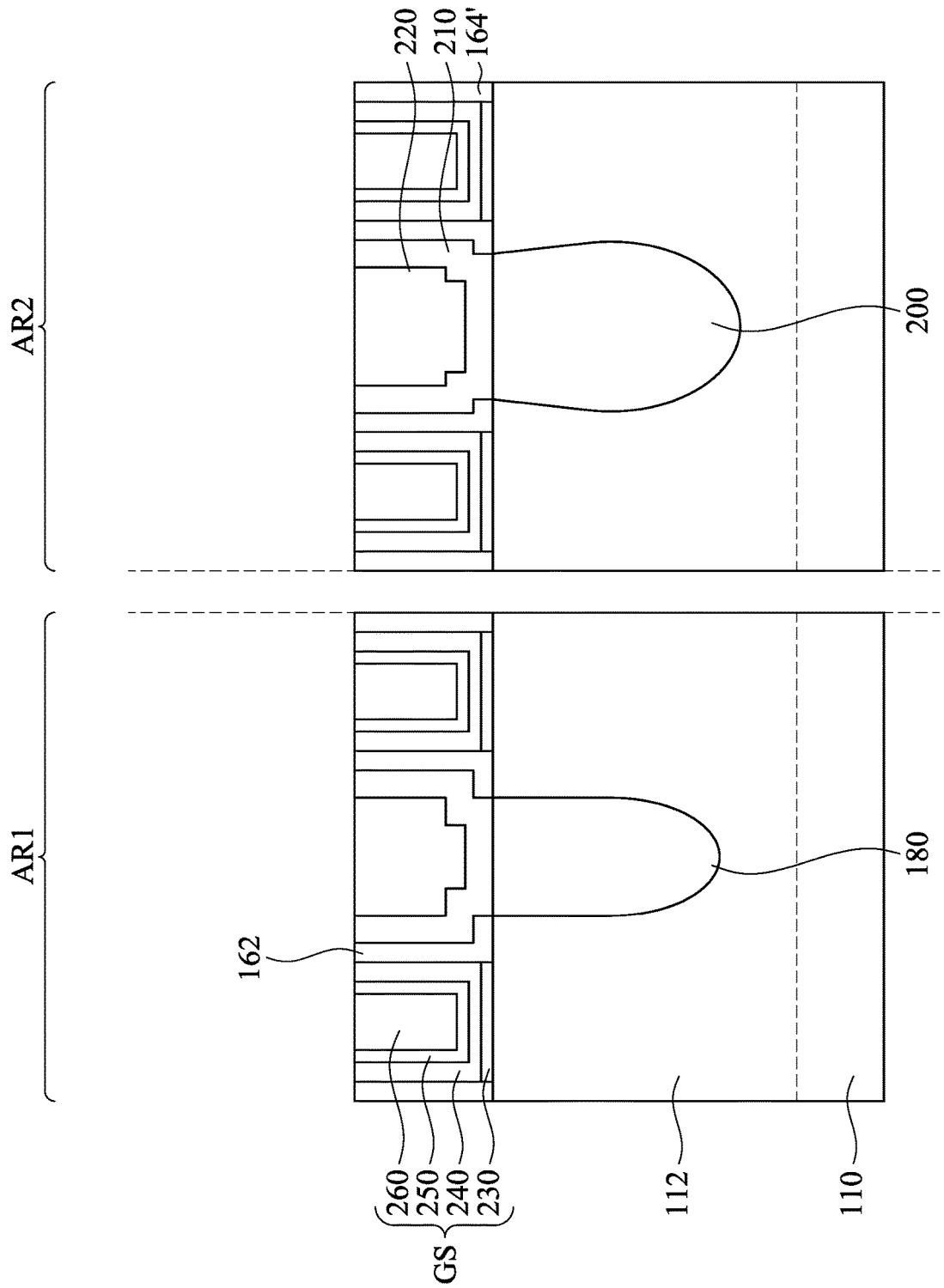
Figure 14D:
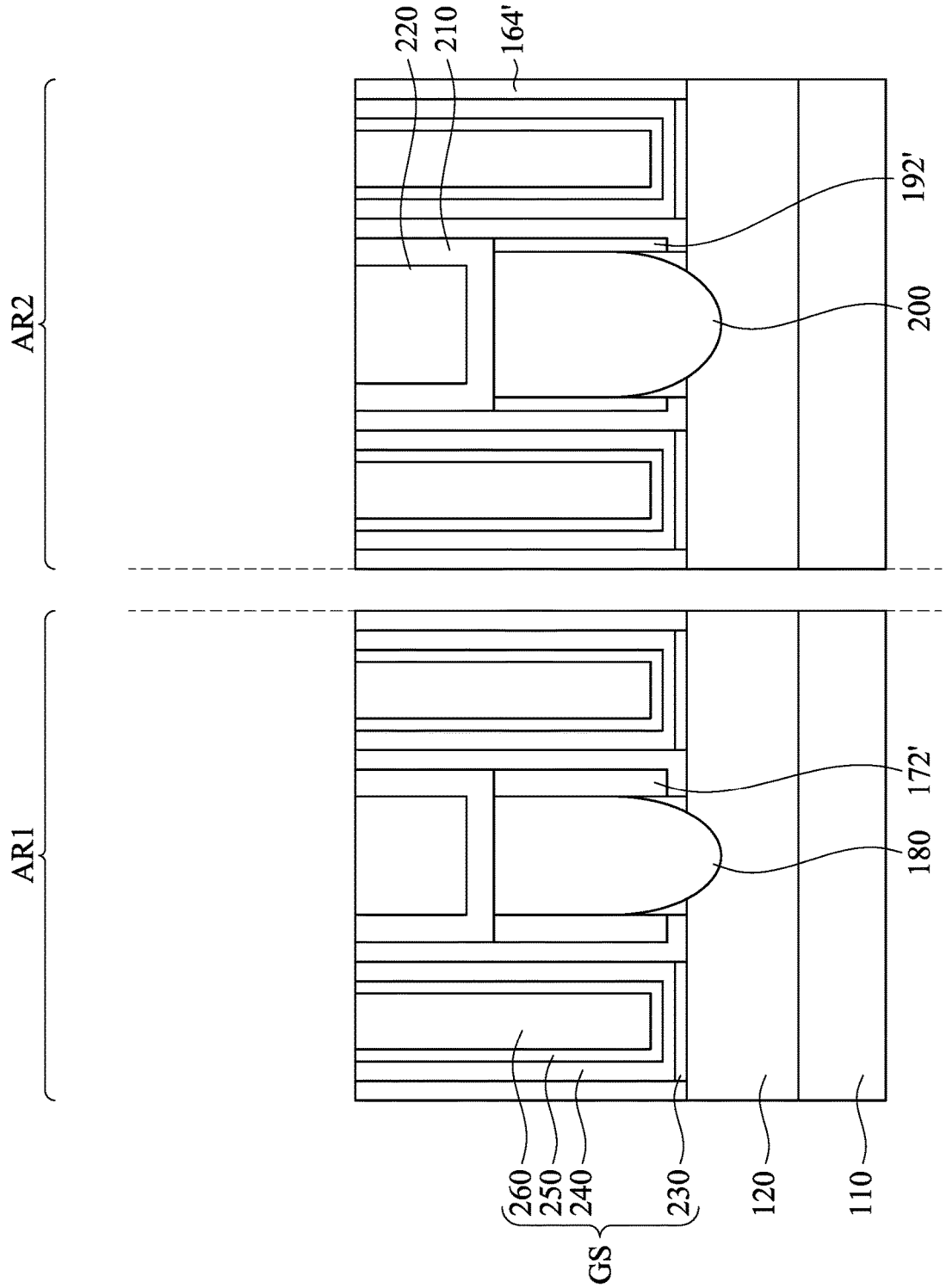

FIGS. 13A-13C illustrate a top view and cross-sectional views of formation of an interlayer dielectric (ILD) layer. After the formation of the CESL 210, an ILD layer 220 is formed over the substrate 110. In some embodiments, the ILD layer 220 may has a different etch selectivity than that of the CESL 210. The ILD layer 220 may be include any suitable dielectric or insulating material such as, but not limited to, silicon dioxide, SiOF, carbon-doped oxide, a glass or polymer material. For example, the dielectric material of the ILD layer 220 may include tetrathoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, Parylene, BCB (bis-benzocyclobutenes), polyimide, the like, or combinations thereof. The ELK dielectric material has a dielectric constant less than, for example, about 2.5. It is understood that the ILD layer 220 may include one or more dielectric materials and/or one or more dielectric layers. In some embodiments, the ILD layer 220 may be deposited by chemical vapor deposition (CVD), high density plasma (HDP) CVD, sub-atmospheric CVD (SACVD), spin-on coating, sputtering, or other suitable techniques. In some other embodiments, the ILD layer 220 may include multiple layers of the same or differing dielectric materials may instead be used. A CMP process may be performed to remove an excess portion of the ILD layer 220 until reaching the dummy gate structures DG. The CMP may remove the patterned mask 152 of the dummy gate structures DG. After the CMP process, the dummy gate 142 of the dummy gate structures DG are exposed from the ILD layer 220.

FIGS. 14A-14D illustrate a top view and cross-sectional views of a replacement gate (RPG) process scheme. The dummy gate structures DG are replaced with metal gate structures GS. For example, the dummy gate structures DG (see FIGS. 13A-13C) are removed to form a plurality of gate trenches. The dummy gate structures DG are removed by a selective etch process, including a selective wet etch or a selective dry etch, and carries a substantially vertical profile of the gate spacers 140. The gate trenches expose portions of the semiconductor fins 112 of the substrate 110. Then, the metal gate structures GS are formed respectively in the gate trenches and cover the semiconductor fins 112 of the substrate 110. The gate structure GS may include a gate dielectric layer and a metal gate over the gate dielectric layer.

The gate dielectric layer in the gate structure GS may include an interfacial layer 230 and a high-k dielectric layer 240 over the interfacial layer 230. The interfacial layer 230 may include silicon oxides, for example, formed by thermal oxidation process. The high-k dielectric layers 240, as used and described herein, include dielectric materials having a high dielectric constant, for example, greater than that of thermal silicon oxide (~3.9). The high-k dielectric layers 240 may include a high-k dielectric layer such as tantalum, hafnium, titanium, lanthanum, aluminum and their carbide, silicide, nitride, boride combinations. The high-k dielectric layers 240 may include other high-K dielectrics, such as $HfO_2$, $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$(BST), $Al_2O_3$, $Si_3N_4$, oxynitrides (SiON), combinations thereof, or other suitable material. The high-k dielectric layers 240 may be formed by ALD, PVD, CVD, oxidation, and/or other suitable methods. In some embodiments, the high-k dielectric layers 240 may include the same or different materials.

The metal gate in the gate structure GS may include a work function metal layer 250 over the high-k dielectric layer 240. The work function metal layer 250 may have a suitable work function to enhance the device performance, and the work function metal layers 250 in region AR1 may include a material different from the work function metal layers 250 in the region AR2. For example, in the region AR1, the work function metal layer 250 may be an n-type work function layer, which includes one or more n-type work function metals, such as Ti, Ag, TaAl, TaAlC, TiAlN, TaC, TaCN, TaSiN, Mn, Zr, other suitable n-type work function materials, or combinations thereof. In the region AR2, the work function metal layer 250 may be a p-type work function layer, which includes one or more p-type work function metals, such as TiN, TaN, Ru, Mo, Al, WN, $ZrSi_2$, $MoSi_2$, $TaSi_2$, $NiSi_2$, WN, other suitable p-type work function materials, or combinations thereof. The work function layers may include a plurality of layers. The work function layer(s) may be deposited by CVD, PVD, electroplating and/or other suitable process.

In some embodiments, the metal gate in the gate structure GS may further include a fill metal 260 over the work function metal layer 250. The filling metal 260 may fill a recess in the work function metal layer 250. The filling metal 260 may include metal or metal alloy. For example, the filling metal 260 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. In some embodiments, a chemical mechanical polishing process may be optionally performed, so as to level the top surfaces of the work function metal layer 250 and the filling metal 260. The filling metal 260 may be referred to as gate conductor in this context. In some embodiments, in addition to the fill metal 260, the metal gate in the gate structure GS may further include a liner layer, a wetting layer, and/or an adhesion layer.

Figure 15A:
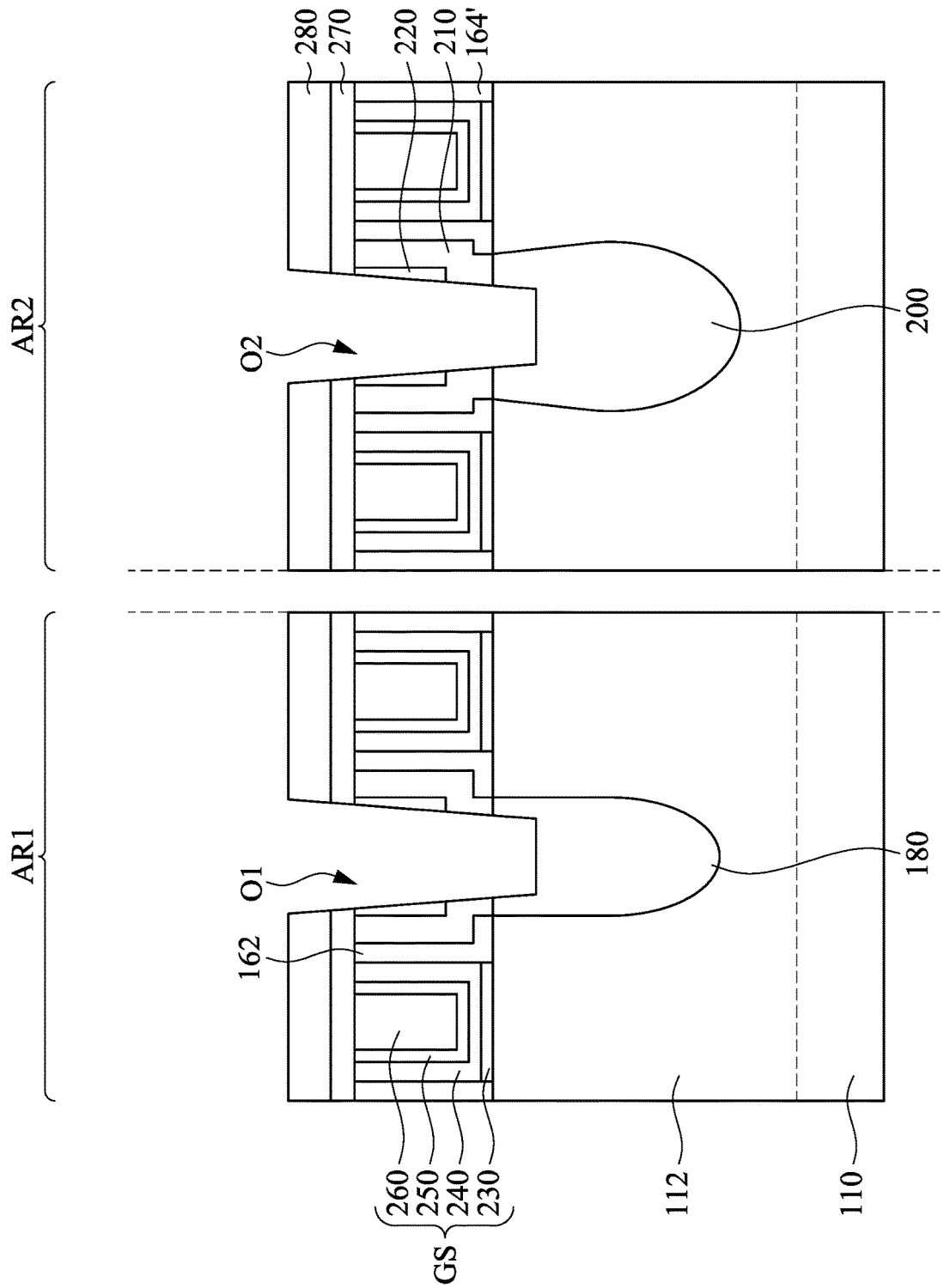
Figure 15B:
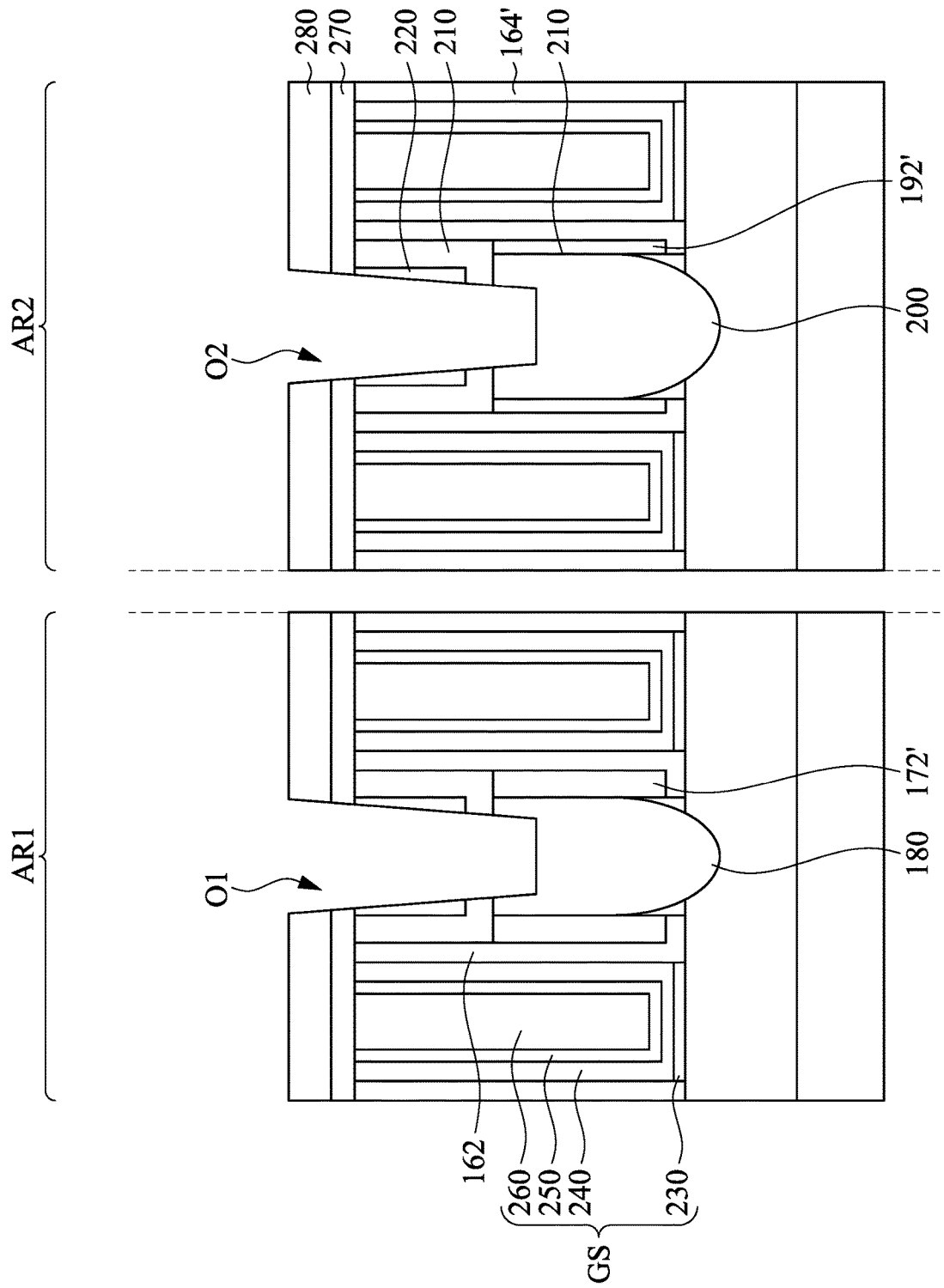

FIGS. 15A and 15B illustrate cross-sectional views of formation of source/drain contact openings O1 and O2. An etch stop layer 270 and an ILD layer 280 are formed over the ILD layer 220 and the gate structure GS. The etch stop layer 270 may be formed of a similar material to the CESL 210 by using similar deposition techniques to the CESL 210 as discussed previously, and thus are not described again for the sake of brevity. The ILD layer 280 may be formed of a similar material to the ILD layer 220 by using similar deposition techniques to the ILD layer 220 as discussed previously, and thus are not described again for the sake of brevity. One or more etching processes are performed to etch through the ILD layer 280, the etch stop layer 270, the ILD layer 220, and the CESL 210, thereby forming the source/drain contact openings O1 and O2. The source/drain contact openings O1 and O2 expose the source/drain epitaxial structures 180 and 200, respectively. In the depicted embodiments, the etching process used to form the source/drain contact openings O1 and O2 further etches the top portions of the source/drain epitaxial structures 180 and 200.

Figure 16A:
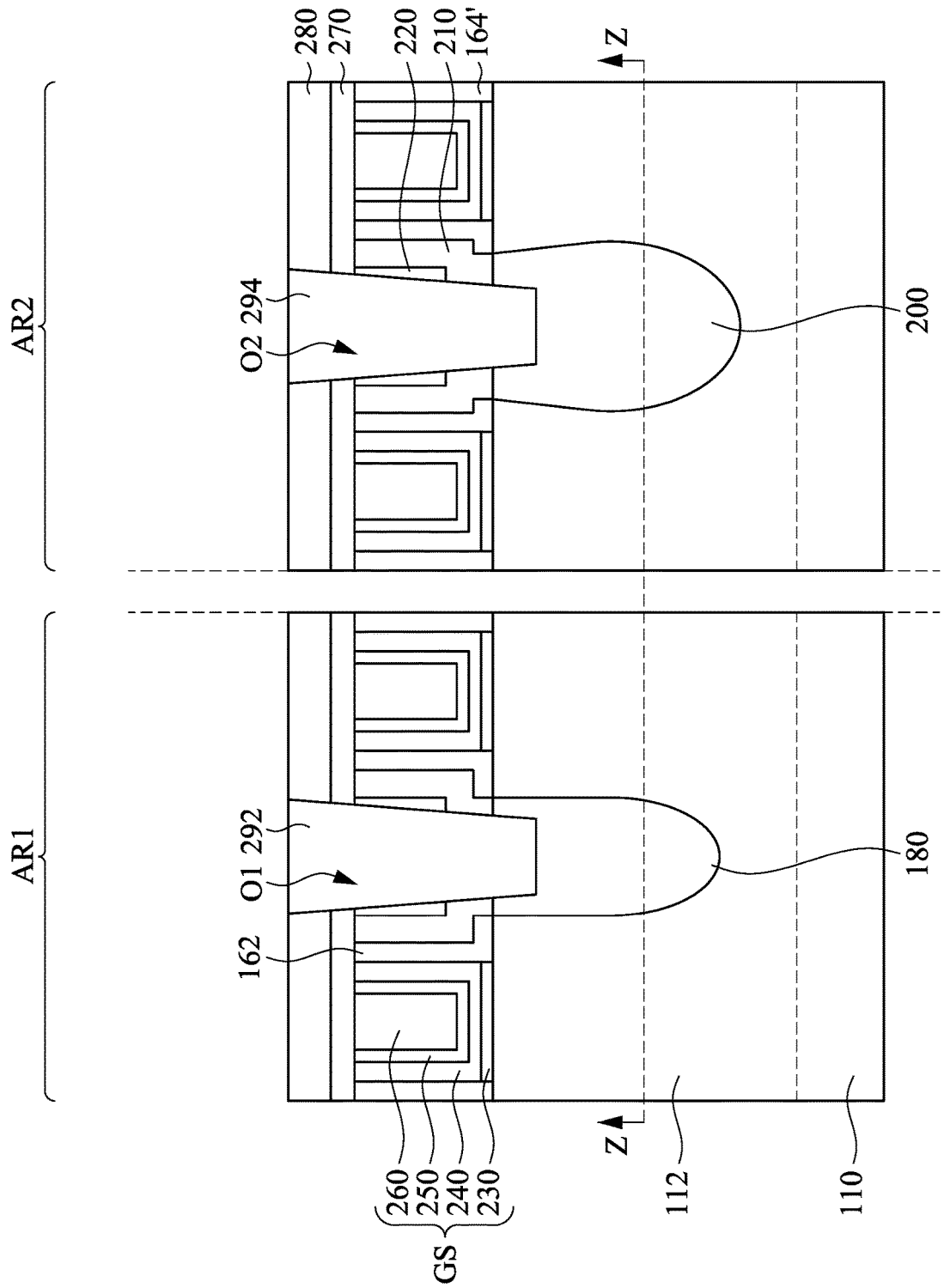
FIG. 16C is a plan view taken along line Z-Z in FIGS. 16A and 16B.
Figure 16B:
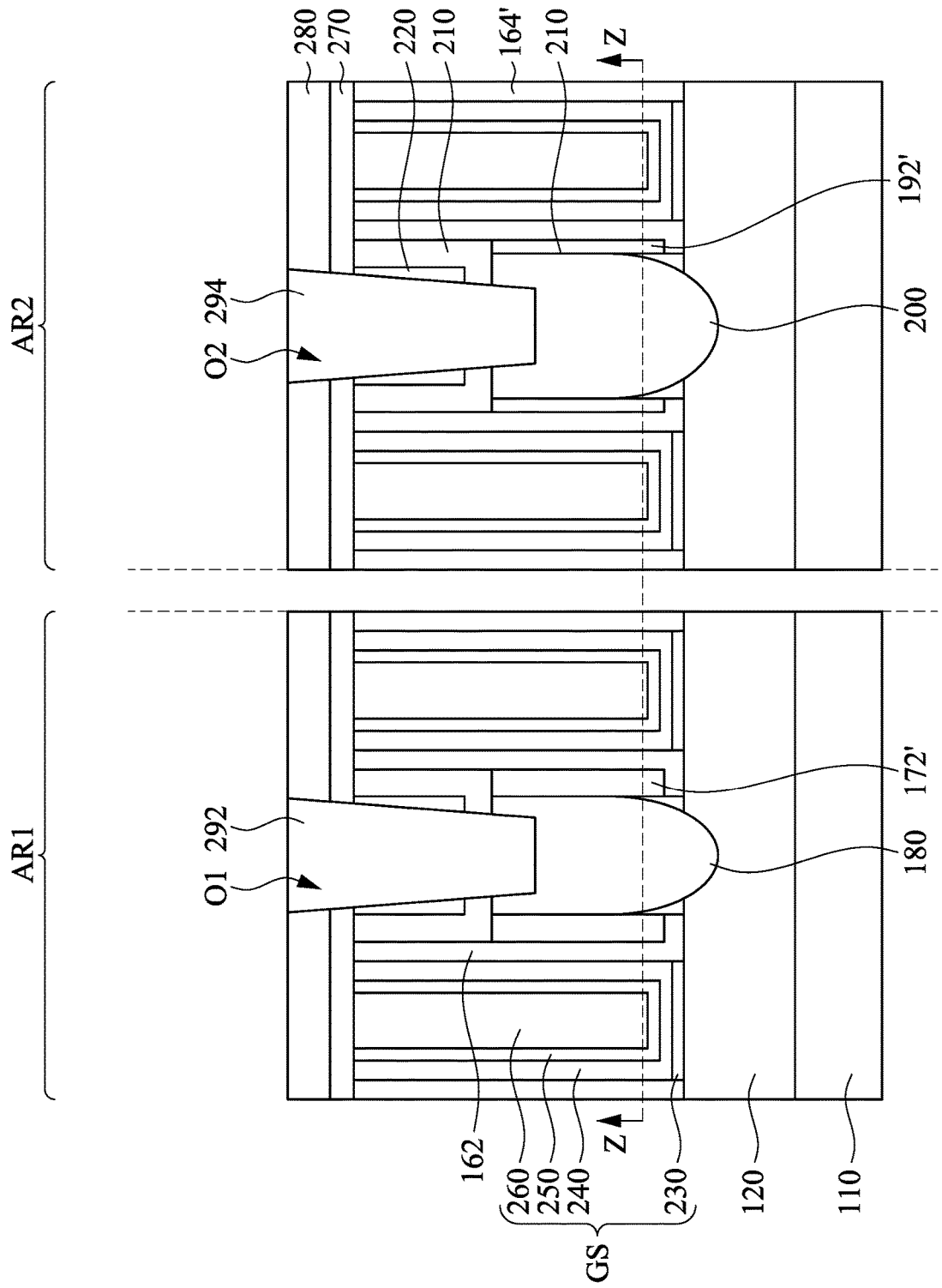

FIGS. 16A and 16B illustrate cross-sectional views of formation of source/drain contact. Source/drain contacts 292 and 294 are respectively formed landing over the source/drain epitaxial structures 180 and 200. The source/drain contacts 292 and 294 may also be referred to as a contact plug. In some embodiments, one or more metal materials are deposited to fill the source/drain contact openings O1 and O3. A CMP process may be performed to remove excess metal materials outside the source/drain contact openings O1 and O3, while leaving metal materials in the source/drain contact openings to serve as the source/drain contacts 292 and 294. The one or more deposited metal materials may include W, Ru, Co, Cu, Ti, TiN, Ta, TaN, Mo, Ni, the like or combinations thereof. The one or more metal materials may be deposited by suitable deposition techniques (e.g., CVD, PVD, ALD, the like or combinations thereof). In some other embodiments, a metal silicide may be formed between the source/drain contact 292/294 and the underlying source/drain epitaxial structure 180/200 for reducing contact resistance.

In some embodiments of the present disclosure, the dummy spacers 172'/192' are at a position lower than top surfaces of the epitaxial structures 180/200, not between portions of the contacts 292/294 higher than the top surfaces of the epitaxial structures 180/200 and the gate structure GS. Through the configuration, the device gate-to-contact capacitance and outer fringe capacitance may be mainly influenced by the CESL 210 and the gate spacers 162/164', less or not substantially influenced by the dummy spacers 172'/192'.

Figure 16C:
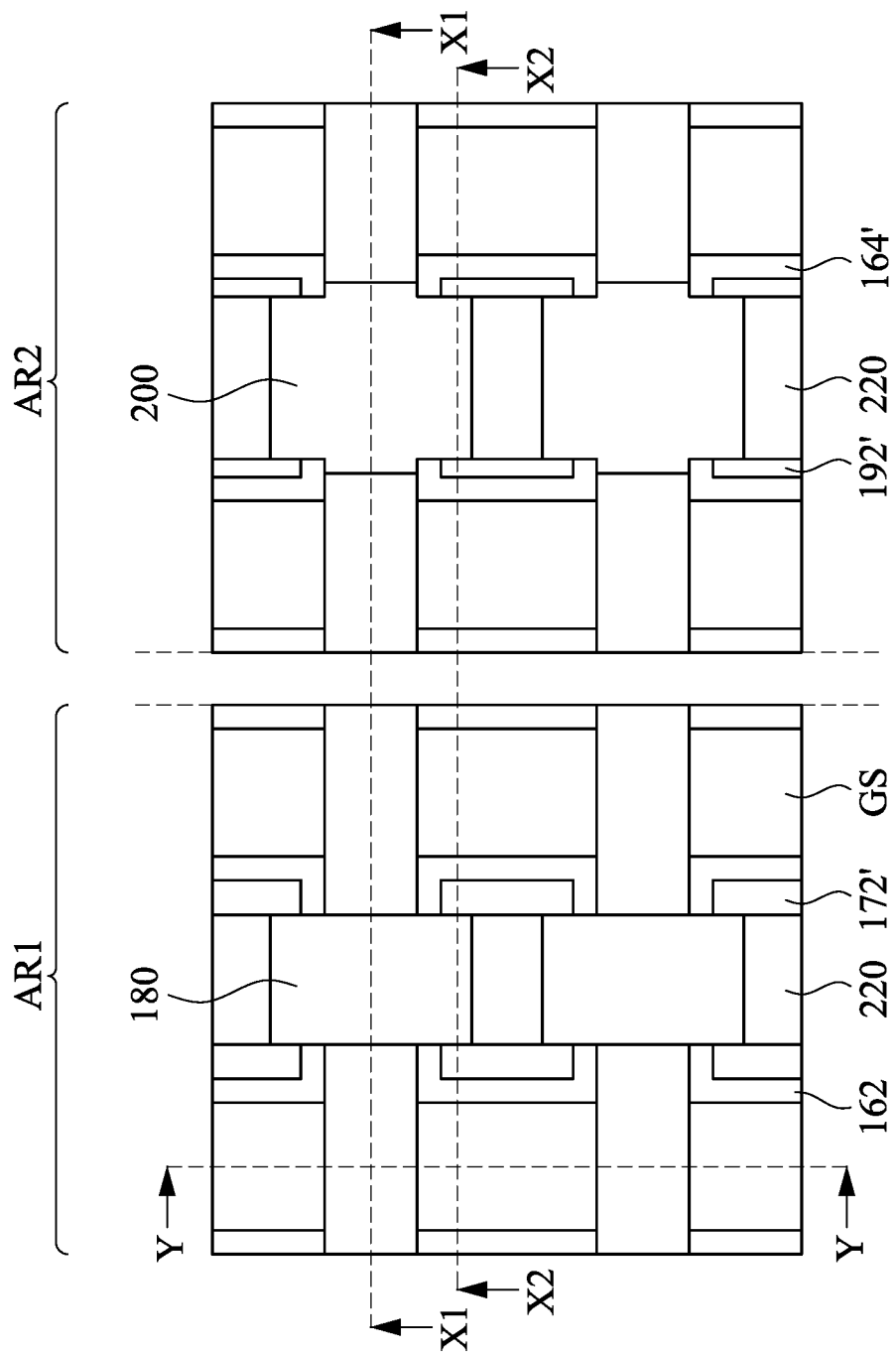

FIG. 16C is a plan view taken along line Z-Z in FIGS. 16A and 16B. Along the fin cut (e.g., the line X1-X1), the source/drain epitaxial structures 180 and 200 are in direct contact with the fins 112 with no dummy spacers therebetween. Along the STI cut (e.g., the line X2-X2), the dummy spacers 172' surround the n-type source/drain epitaxial structures 180, and one of the dummy spacers 172' is between one of the epitaxial structures 180 and one of the gate structure GS. Similarly, along the STI cut (e.g., the line X2-X2), the dummy spacers 192' surround the p-type source/drain epitaxial structures 200, and one of the dummy spacers 192' is between one of the epitaxial structures 200 and one of the gate structure GS. The dummy spacers 172' and 192' can be observed by a transmission electron microscope (TEM). For example, from a TEM image, a difference between a thickness of the dummy spacers 172' and a thickness of the dummy spacers 192' is in a range from about 1 nanometer to about 5 nanometers, or a range from about 1 nanometer to about 3 nanometers.

Based on the above discussions, it can be seen that the present disclosure offers advantages over semiconductor devices. It is understood, however, that other embodiments may offer additional advantages, and not all advantages are necessarily disclosed herein, and that no particular advantage is required for all embodiments. One advantage is that dummy spacers are designed with different thicknesses or materials for device optimization and epitaxial selectivity loss mitigation. Another advantage is the thickness reduction to the dummy spacer results in surface proximity push (around fin top with tri-gate control), thereby lowering the channel resistance and the parasitic resistance and boosting the device drain current (DC). Another advantage is that the device gate-to-contact capacitance and outer fringe capacitance are not substantially affected by the dummy spacers with different thicknesses. Still another advantage is that the thin dummy spacer enlarges the space for epitaxial growth, thereby mitigating epitaxial nodule and improve the yield.

According to some embodiments of the present disclosure, a method for manufacturing a semiconductor device is provided. The method includes forming a first semiconductor fin and a second semiconductor fin over a semiconductor substrate; forming a first gate structure and a second gate structure respectively over a first region of the first semiconductor fin and a first region of the second semiconductor fin; forming a first dummy spacer at a sidewall of the first gate structure adjacent a second region of the first semiconductor fin; etching a first source/drain recess in the second region of the first semiconductor fin; forming a n-type source/drain epitaxial structure in the first source/drain recess; forming a second dummy spacer at a sidewall of the second gate structure adjacent a second region of the second semiconductor fin, wherein the second dummy spacer has a thickness less than that of the first dummy spacer; etching a second source/drain recess in the second region of the second semiconductor fin; and forming a p-type source/drain epitaxial structure in the second source/drain recess.

According to some embodiments of the present disclosure, a method for manufacturing a semiconductor device is provided. The method includes forming a first gate structure, a second gate structure, a third gate structure, and a fourth gate structure over a semiconductor substrate, wherein the first gate structure is next to the second gate structure, and the third gate structure is next to the fourth gate structure; forming a first dummy spacer and a second dummy spacer respectively at sidewalls of the first and second gate structures facing each other, wherein the first and second dummy spacers expose a first region of the semiconductor substrate; forming a first-type source/drain epitaxial structure in the first region of the semiconductor substrate; forming a third dummy spacer and a fourth dummy spacer respectively at sidewalls of the third and fourth gate structures facing each other, wherein the third and fourth dummy spacers expose a second region of the semiconductor substrate, and a width of the second region is greater than a width of the first region; and forming a second-type source/drain epitaxial structure in the second region of the semiconductor substrate.

According to some embodiments of the present disclosure, a semiconductor device includes a semiconductor substrate, a first transistor, a second transistor, a first dummy spacer, and a second dummy spacer. The first and second transistors are over the semiconductor substrate. The first transistor comprises a first semiconductor fin, a first gate structure over a first region of the first semiconductor fin, and a first-type source/drain epitaxial structure over a second region of the first semiconductor fin. The second transistor comprises a second semiconductor fin, a second gate structure over a first region of the second semiconductor fin, and a second-type source/drain epitaxial structure over a second region of the second semiconductor fin. The first dummy spacer is between the first gate structure and the first-type source/drain epitaxial structure. The second dummy spacer is between the second gate structure and the second-type source/drain epitaxial structure. The second dummy spacer has a thickness less than that of the first dummy spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a first semiconductor fin and a second semiconductor fin over a semiconductor substrate;
   forming a first gate structure and a second gate structure respectively over a first region of the first semiconductor fin and a first region of the second semiconductor fin;
   forming a first dummy spacer at a sidewall of the first gate structure adjacent a second region of the first semiconductor fin;
   etching a first source/drain recess in the second region of the first semiconductor fin;
   forming an n-type source/drain epitaxial structure in the first source/drain recess and in direct contact with the first dummy spacer;
   forming a second dummy spacer at a sidewall of the second gate structure adjacent a second region of the second semiconductor fin, wherein the second dummy spacer has a thickness less than that of the first dummy spacer;
   etching a second source/drain recess in the second region of the second semiconductor fin; and
   forming a p-type source/drain epitaxial structure in the second source/drain recess.

2. The method of claim 1, further comprising:
   prior to forming the first dummy spacer and forming the second dummy spacer, depositing a gate spacer layer alongside the sidewall of the first gate structure and the sidewall of the second gate structure, wherein each of the first dummy spacer and the second dummy spacer comprises a dielectric material different from a material of the gate spacer layer.

3. The method of claim 2, wherein each of the first dummy spacer and the second dummy spacer have a higher k value than a k value of the gate spacer layer.

4. The method of claim 1, wherein forming the second dummy spacer is performed after forming the n-type source/drain epitaxial structure.

5. The method of claim 1, further comprising:
   after forming the n-type source/drain epitaxial structure, etching the first dummy spacer to remove a first portion of the first dummy spacer over the first semiconductor fin.

6. The method of claim 5, wherein etching the first dummy spacer is further performed to recess a second portion of the first dummy spacer over an isolation structure surrounding the first semiconductor fin to yield a recessed second portion of the first dummy spacer, such that a top surface of the recessed second portion of the first dummy spacer is lower than a top surface of the first gate structure.

7. The method of claim 6, further comprising:
   depositing a dielectric layer over the recessed second portion of the first dummy spacer and the n-type source/drain epitaxial structure; and
   forming a contact in the dielectric layer and landing on the n-type source/drain epitaxial structure.

8. The method of claim 1, further comprising:
   after forming the p-type source/drain epitaxial structure, etching the second dummy spacer to remove a first portion of the second dummy spacer over the second semiconductor fin.

9. The method of claim 8, wherein etching the second dummy spacer is further performed to recess a second portion of the second dummy spacer over an isolation structure surrounding the second semiconductor fin to yield a recessed second portion of the second dummy spacer, such that a top surface of the recessed second portion of the second dummy spacer is lower than a top surface of the second gate structure.

10. The method of claim 1, further comprising:
    etching back the first dummy spacer after forming the n-type source/drain epitaxial structure to reduce a height of the first dummy spacer; and
    forming the second dummy spacer over the first dummy spacer after etching back the first dummy spacer.

11. A method for manufacturing a semiconductor device, comprising:
    forming a first gate structure, a second gate structure, a third gate structure, and a fourth gate structure over a semiconductor substrate, wherein the first gate structure is next to the second gate structure, and the third gate structure is next to the fourth gate structure;
    forming a first dummy spacer and a second dummy spacer respectively at sidewalls of the first gate structure and the second gate structure facing each other, wherein the first dummy spacer and the second dummy spacer expose a first region of the semiconductor substrate;
    forming a first source/drain epitaxial structure in the first region of the semiconductor substrate;
    forming a third dummy spacer and a fourth dummy spacer respectively at sidewalls of the third gate structure and the fourth gate structure facing each other, wherein the third dummy spacer and the fourth dummy spacer expose a second region of the semiconductor substrate, and a width of the second region is greater than a width of the first region; and
    forming a second source/drain epitaxial structure in the second region of the semiconductor substrate.

12. The method of claim 11, wherein the first source/drain epitaxial structure is doped with a first dopant, and the second source/drain epitaxial structure is doped with a second dopant, and a diffusivity of the first dopant in the first source/drain epitaxial structure is greater than a diffusivity of the second dopant in the second source/drain epitaxial structure.

13. The method of claim 11, wherein the first source/drain epitaxial structure and the second source/drain epitaxial structure are of opposite conductive types.

14. The method of claim 11, wherein the first source/drain epitaxial structure is doped with an n-type dopant, and the second source/drain epitaxial structure is doped with a p-type dopant.

15. The method of claim 11, wherein a thickness of the third dummy spacer and the fourth dummy spacer is less than a thickness of the first dummy spacer and the second dummy spacer.

16. A semiconductor device, comprising:
    a semiconductor substrate;
    a first transistor over the semiconductor substrate, wherein the first transistor comprises a first semiconductor fin, a first gate structure over a first region of the first semiconductor fin, and a first source/drain epitaxial structure over a second region of the first semiconductor fin;
a second transistor over the semiconductor substrate, wherein the second transistor comprises a second semiconductor fin, a second gate structure over a first region of the second semiconductor fin, and a second source/drain epitaxial structure over a second region of the second semiconductor fin;
a first dummy spacer between the first gate structure and the first source/drain epitaxial structure, wherein a top end of the first dummy spacer is lower than a top surface of a work function metal layer of the first gate structure; and
a second dummy spacer between the second gate structure and the second source/drain epitaxial structure, wherein the second dummy spacer has a thickness less than that of the first dummy spacer.

17. The semiconductor device of claim 16, wherein the first source/drain epitaxial structure is an n-type source/drain epitaxial structure, and the second source/drain epitaxial structure is a p-type source/drain epitaxial structure.

18. The semiconductor device of claim 16, wherein a top end of the second dummy spacer is lower than a top surface of the second gate structure.

19. The semiconductor device of claim 16, further comprising:
a plurality of isolation structures surrounding the first semiconductor fin and the second semiconductor fin, wherein the first dummy spacer and the second dummy spacer are over the isolation structures.

20. The semiconductor device of claim 16, wherein a width of the first source/drain epitaxial structure is greater than a width of the second source/drain epitaxial structure.

* * * * *